(12) United States Patent
Devlin et al.

(10) Patent No.: US 11,815,668 B2
(45) Date of Patent: Nov. 14, 2023

(54) ATOMIC LAYER DEPOSITION PROCESS FOR FABRICATING DIELECTRIC METASURFACES FOR WAVELENGTHS IN THE VISIBLE SPECTRUM

(71) Applicant: PRESIDENT AND FELLOWS OF HARVARD COLLEGE, Cambridge, MA (US)

(72) Inventors: Robert C. Devlin, Cambridge, MA (US); Mohammadreza Khorasaninejad, Cambridge, MA (US); Federico Capasso, Cambridge, MA (US); Hongkun Park, Cambridge, MA (US); Alexander Arthur High, Cambridge, MA (US)

(73) Assignees: PRESIDENT AND FELLOWS OF HARVARD COLLEGE, Cambridge, MA (US); THE CHARLES STARK DRAPER LABORATORY, INC., Cambridge, MA (US)

( * ) Notice: Subject to any disclaimer, the term of this patent is extended or adjusted under 35 U.S.C. 154(b) by 0 days.

(21) Appl. No.: 17/824,823

(22) Filed: May 25, 2022

(65) Prior Publication Data
US 2022/0283411 A1 Sep. 8, 2022

Related U.S. Application Data

(62) Division of application No. 15/778,208, filed as application No. PCT/US2016/063617 on Nov. 23, 2016, now Pat. No. 11,366,296.
(Continued)

(51) Int. Cl.
*G02B 1/00* (2006.01)
*G02B 1/02* (2006.01)
(Continued)

(52) U.S. Cl.
CPC ............ *G02B 13/14* (2013.01); *C23C 16/042* (2013.01); *C23C 16/45525* (2013.01);
(Continued)

(58) Field of Classification Search
CPC ........ G02B 13/14; G02B 1/002; G02B 1/005; G02B 1/02; C23C 16/042;
(Continued)

(56) References Cited

U.S. PATENT DOCUMENTS

| 3,877,034 A | 4/1975 | Nelson |
| 5,245,466 A | 9/1993 | Burns et al. |

(Continued)

FOREIGN PATENT DOCUMENTS

| CN | 104374745 A | 2/2015 |
| JP | 2004-302457 A | 10/2004 |

(Continued)

OTHER PUBLICATIONS

Aieta, Francesco et al., "Multiwavelength Achromatic Metasurfaces by Dispersive Phase Compensation", Science, Mar. 20, 2015, 15 pages.
(Continued)

*Primary Examiner* — Jade R Chwasz
(74) *Attorney, Agent, or Firm* — FOLEY & LARDNER LLP

(57) ABSTRACT

A method of fabricating a visible spectrum optical component includes: providing a substrate; forming a resist layer over a surface of the substrate; patterning the resist layer to form a patterned resist layer defining openings exposing portions of the surface of the substrate; performing deposition to form a dielectric film over the patterned resist layer and over the exposed portions of the surface of the substrate, wherein a top surface of the dielectric film is above a top surface of the patterned resist layer; removing a top portion
(Continued)

of the dielectric film to expose the top surface of the patterned resist layer and top surfaces of dielectric units within the openings of the patterned resist layer; and removing the patterned resist layer to retain the dielectric units over the substrate.

22 Claims, 13 Drawing Sheets

Related U.S. Application Data

(60) Provisional application No. 62/259,243, filed on Nov. 24, 2015.

(51) Int. Cl.

| | |
|---|---|
| *G02B 13/14* | (2006.01) |
| *H01L 31/02* | (2006.01) |
| *G03F 7/00* | (2006.01) |
| *G03F 7/40* | (2006.01) |
| *C23C 16/56* | (2006.01) |
| *C23C 16/455* | (2006.01) |
| *C23C 16/04* | (2006.01) |

(52) U.S. Cl.
CPC ........ *C23C 16/45555* (2013.01); *C23C 16/56* (2013.01); *G02B 1/002* (2013.01); *G02B 1/005* (2013.01); *G03F 7/0005* (2013.01); *G03F 7/40* (2013.01); *H01L 31/02* (2013.01); *G02B 1/02* (2013.01)

(58) Field of Classification Search
CPC ........ C23C 16/45525; C23C 16/45555; C23C 16/56; G03F 7/0005; G03F 7/40; H01L 31/02
See application file for complete search history.

(56) References Cited

U.S. PATENT DOCUMENTS

| | | | |
|---|---|---|---|
| 5,620,792 | A | 4/1997 | Challener, IV |
| 9,952,096 | B2* | 4/2018 | Kats ................ G01J 3/26 |
| 2003/0077983 | A1 | 4/2003 | Hagan et al. |
| 2004/0184752 | A1 | 9/2004 | Aoki et al. |
| 2005/0161589 | A1 | 7/2005 | Kim et al. |
| 2005/0211665 | A1 | 9/2005 | Gao et al. |
| 2006/0127829 | A1 | 6/2006 | Deng et al. |
| 2007/0030870 | A1 | 2/2007 | Bour et al. |
| 2008/0014632 | A1 | 1/2008 | Cunningham et al. |
| 2010/0033701 | A1 | 2/2010 | Lee et al. |
| 2010/0055621 | A1 | 3/2010 | Hatakeyama et al. |
| 2010/0072170 | A1* | 3/2010 | Wu .............. G02B 5/3058 216/13 |
| 2010/0255428 | A1 | 10/2010 | Chen et al. |
| 2012/0269483 | A1 | 10/2012 | Mossberg et al. |
| 2013/0032949 | A1* | 2/2013 | Lin ............. H01L 23/53295 257/774 |
| 2013/0037873 | A1 | 2/2013 | Suzuki et al. |
| 2014/0009823 | A1 | 1/2014 | Park et al. |
| 2014/0210835 | A1 | 7/2014 | Hong et al. |
| 2015/0011073 | A1 | 1/2015 | Lei et al. |
| 2015/0068599 | A1 | 3/2015 | Chou et al. |
| 2015/0116721 | A1 | 4/2015 | Kats et al. |
| 2015/0125111 | A1 | 5/2015 | Orcutt et al. |
| 2015/0185413 | A1 | 7/2015 | Greiner et al. |
| 2019/0064532 | A1* | 2/2019 | Riley, Jr. ............. G02B 6/428 |
| 2019/0154877 | A1* | 5/2019 | Capasso ............. G02B 1/002 |
| 2021/0318466 | A1* | 10/2021 | Uenoyama ........... G02B 3/08 |

FOREIGN PATENT DOCUMENTS

| | | |
|---|---|---|
| JP | 2005-017408 A | 1/2005 |
| JP | 2008-046428 A | 2/2008 |
| JP | 2008-299084 A | 12/2008 |
| JP | 2010-085977 A | 4/2010 |
| JP | 2015-502581 A | 1/2015 |
| WO | WO-2016/086204 A1 | 6/2016 |
| WO | WO-2016/140720 A2 | 9/2016 |
| WO | WO-2017/176921 A1 | 10/2017 |

OTHER PUBLICATIONS

Byrnes, Steven J., et al., "Designing large, high-efficiency, high-numerical-aperture, transmissive meta-lenses for visible light", Optics Express, vol. 24, No. 5, Mar. 7, 2016, 15 pages.
Extended European Search Report for corresponding EP Appl. No. 16869282.0, dated Jan. 13, 2022, 6 pages.
Extended Search Report for EP Application No. 16869282.0, dated Nov. 20, 2019, 15 pages.
Final Office Action for U.S. Appl. No. 15/778,208, dated Jul. 8, 2020, 10 pages.
Final Office Action for U.S. Appl. No. 15/778,208, dated Oct. 20, 2021, 13 pages.
Final Office Action for U.S. Appl. No. 15/778,208, dated Mar. 30, 2021, 11 pages.
Foreign Action other than Search Report on CN 201680077924.9 dated Aug. 30, 2019.
International Search Report and Written Opinion for International Patent Application No. PCT/US2016/063617, dated Mar. 31, 2017.
Khorasaninejad, M. et al., "Planar Lenses at Visible Wavelengths", Arxiv, https://arxiv.org/ftp/arxiv/papers/1605/1605.02248.pdf, May 7, 2016, 17 pages.
Kokkoris et al.: "Nanoscale Roughness Effects at the Interface of Lithography and Plasma Etching: Modeling of Line-Edge-Roughness Transfer During Plasma Etching," IEEE Transactions on Plasma Science, vol. 37, No. 9, Sep. 2009, pp. 1705-1714 (Year: 2009).
Kokkoris, George et al., "Nanoscale Roughness Effects at the Interface of Lithography and Plasma Etching: Modeling on Line-Edge-Roughness Transfer During Plasma Etching" IEEE Transactions on Plasma Science, vol. 37, No. 9, Sep. 2009, pp. 1705-1714.
Miyazaki et al., "Ultraviolet-nanoimprinted packaged metasurface thermal emitters for infrared Co2 sensing", Sci. Technol. Adv. Mater. 16 (2016, 5 pgs.
Non-Final Office Action for U.S. Appl. No. 15/778,208, dated Mar. 3, 2020, 11 pages.
Non-Final Office Action for U.S. Appl. No. 15/778,208, dated Dec. 30, 2020, 11 pages.
Non-Final Office Action for U.S. Appl. No. 15/778,208, dated Jul. 14, 2021, 11 pages.
Notice of Allowance for U.S. Appl. No. 15/778,208, dated Feb. 18, 2022, 9 pages.
Notice of Reasons for Rejection for corresponding Japanese Patent Application No. JP2018-546404, dated Apr. 5, 2021, 6 pages (with English translation).
Notice of Reasons for Rejection for corresponding Japanese Patent Application No. JP2018-546404, dated Sep. 28, 2020, 12 pages (with English translation).
Office Action for corresponding Chinese Patent Application No. 20168007792.9, dated Aug. 30, 2019, 8 pages.
Office Action in corresponding Chinese Patent Application No. 202010472363.0, with English Translation, dated May 10, 2021, 18 pages.
Partial Search Report for corresponding EP Patent Application No. 16869282.0, dated Jul. 2, 2019, 13 pages.
Search Report for corresponding Chinese Patent Application No. 20168007792.9, dated Aug. 30, 2019, 4 pages.
Search Report in corresponding Chinese Patent Application No. 202010472363.0, with English Translation, dated May 10, 2021, 7 pages.
Second Office Action on SG Appl. No. 10202004257W, dated Mar. 2, 2022.
Written Opinion and Search Report for corresponding Singapore Patent Application No. 10202004257W, dated Feb. 4, 2021, 8 pages.

(56) References Cited

OTHER PUBLICATIONS

Yu, Ye Feng et al., "High-transmission dielectric metasurfaces with 2 phase control at visible wavelengths", Laser Photonics Rev. 9, No. 4, Jun. 26, 2015, pp. 412-418.
Office Action for corresponding Canadian Patent Application No. 3,006,173, dated Jun. 20, 2023, 4 pages.
Office Action with English translation for corresponding Korean Patent Application No. 10-2018- 7016258, dated Jul. 7, 2023, 15 pages.

* cited by examiner

A

B

2

ATOMIC LAYER DEPOSITION PROCESS FOR FABRICATING DIELECTRIC METASURFACES FOR WAVELENGTHS IN THE VISIBLE SPECTRUM

CROSS-REFERENCE TO RELATED APPLICATION

This application is a divisional application of U.S. patent application Ser. No. 15/778,208, filed May 22, 2018, which is a National Stage Entry of International Application No. PCT/US2016/063617, filed Nov. 23, 2016, which claims the benefit of and priority to U.S. Provisional Patent Application No. 62/259,243 filed Nov. 24, 2015, the contents of which are incorporated herein by reference in their entirety.

STATEMENT REGARDING FEDERALLY SPONSORED RESEARCH OR DEVELOPMENT

This invention was made with Government support under Grant No. FA9550-14-1-0389, awarded by the Air Force Office of Scientific Research (MURI). The Government has certain rights in the invention.

BACKGROUND

Metasurfaces can be used to form optical components. However, metasurfaces have been inefficient in the visible spectrum. It is desirable to fabricate metasurfaces that have improved efficiency in the visible spectrum.

It is against this background that a need arose to develop the embodiments described in this disclosure.

SUMMARY

In an aspect according to some embodiments, a method of fabricating a visible spectrum optical component includes: 1) providing a substrate; 2) forming a resist layer over a surface of the substrate; 3) patterning the resist layer to form a patterned resist layer defining openings exposing portions of the surface of the substrate; 4) performing deposition to form a dielectric film over the patterned resist layer and over the exposed portions of the surface of the substrate, wherein a top surface of the dielectric film is above a top surface of the patterned resist layer; 5) removing a top portion of the dielectric film to expose the top surface of the patterned resist layer and top surfaces of dielectric units within the openings of the patterned resist layer; and 6) removing the patterned resist layer to retain the dielectric units over the substrate.

In some embodiments, performing deposition includes performing atomic layer deposition.

In some embodiments, the substrate is a glass substrate.

In some embodiments, sidewalls of the openings of the patterned resist layer are substantially perpendicular to the surface of the substrate.

In some embodiments, the openings of the patterned resist layer have widths not significantly greater than or less than a design wavelength of incident light, such as no greater than 400 nm.

In some embodiments, the openings of the patterned resist layer have a maximum width $w_{max}$, performing deposition includes depositing the dielectric film to a thickness $t_{film}$ and filling the openings of the patterned resist layer, and $t_{film} \geq w_{max}/2$.

In some embodiments, performing deposition is carried out at a temperature below 115° C.

In some embodiments, the dielectric film includes an oxide.

In some embodiments, removing the top portion of the dielectric film includes performing reactive ion etching.

In some embodiments, at least one of the dielectric units has a height of 100 nm or greater.

In some embodiments, at least one of the dielectric units has a width no greater than 100 nm.

In another aspect according to some embodiments, a method of fabricating a metasurface includes: 1) providing a substrate and a patterned layer over the substrate, the patterned layer defining openings; 2) performing atomic layer deposition to deposit a conformal film over the patterned layer and extending into the openings of the patterned layer; 3) removing a top portion of the conformal film to expose top surfaces of metasurface units within the openings of the patterned layer; and 4) removing the patterned layer to retain the metasurface units over the substrate.

In some embodiments, performing atomic layer deposition includes depositing a dielectric material having an imaginary part of a refractive index no greater than 0.1 over the visible spectrum.

In some embodiments, performing atomic layer deposition includes depositing a dielectric material having a real part of a refraction index of at least 2 over the visible spectrum.

In some embodiments, the patterned layer includes a resist having a glass transition temperature, and performing atomic layer deposition is carried out at a temperature below the glass transition temperature of the resist.

In some embodiments, at least one of the metasurface units has an aspect ratio of at least 2:1.

In a further aspect according to some embodiments, a visible spectrum optical component includes: 1) a transparent substrate including a surface; and 2) dielectric units over the surface of the transparent substrate, wherein at least one of the dielectric units has a dimension along a short axis, a dimension along a long axis that is different from the dimension along the short axis, and a surface roughness of no greater than 5 nm.

In some embodiments, the dimension along the short axis is no greater than 200 nm, the dimension along the long axis is substantially perpendicular to the surface of the transparent substrate and is at least twice the dimension along the short axis.

In some embodiments, a ratio of the dimension along the long axis to the dimension along the short axis is at least 5:1.

In some embodiments, at least one of the dielectric units has a sidewall that is substantially perpendicular to the surface of the transparent substrate.

In some embodiments, the surface roughness is no greater than 2 nm.

In some embodiments, the dielectric units include a dielectric material that is amorphous or single-crystalline.

In some embodiments, the dielectric units include a dielectric material having a light transmittance of at least 50% over the visible spectrum.

In some embodiments, the dielectric units include a dielectric material having an imaginary part of a refractive index no greater than 0.1 over the visible spectrum, and a real part of the refraction index of at least 2 over the visible spectrum.

In some embodiments, the optical component is configured to introduce an arbitrary or adjustable phase profile on incident light.

In some embodiments, the optical component is a lens, a collimator, a polarizer, or a hologram.

In some embodiments, at least one of the dielectric units has a circular cross-section or other cross-section of substantially even rotational symmetry.

In some embodiments, a function of the optical component is dependent on a polarization of incident light.

In some embodiments, a function of the optical component is substantially independent of a polarization of incident light.

Other aspects and embodiments of this disclosure are also contemplated. The foregoing summary and the following detailed description are not meant to restrict this disclosure to any particular embodiment but are merely meant to describe some embodiments of this disclosure.

BRIEF DESCRIPTION OF THE DRAWINGS

For a better understanding of the nature and objects of some embodiments of this disclosure, reference should be made to the following detailed description taken in conjunction with the accompanying drawings.

DETAILED DESCRIPTION

Figure 1:
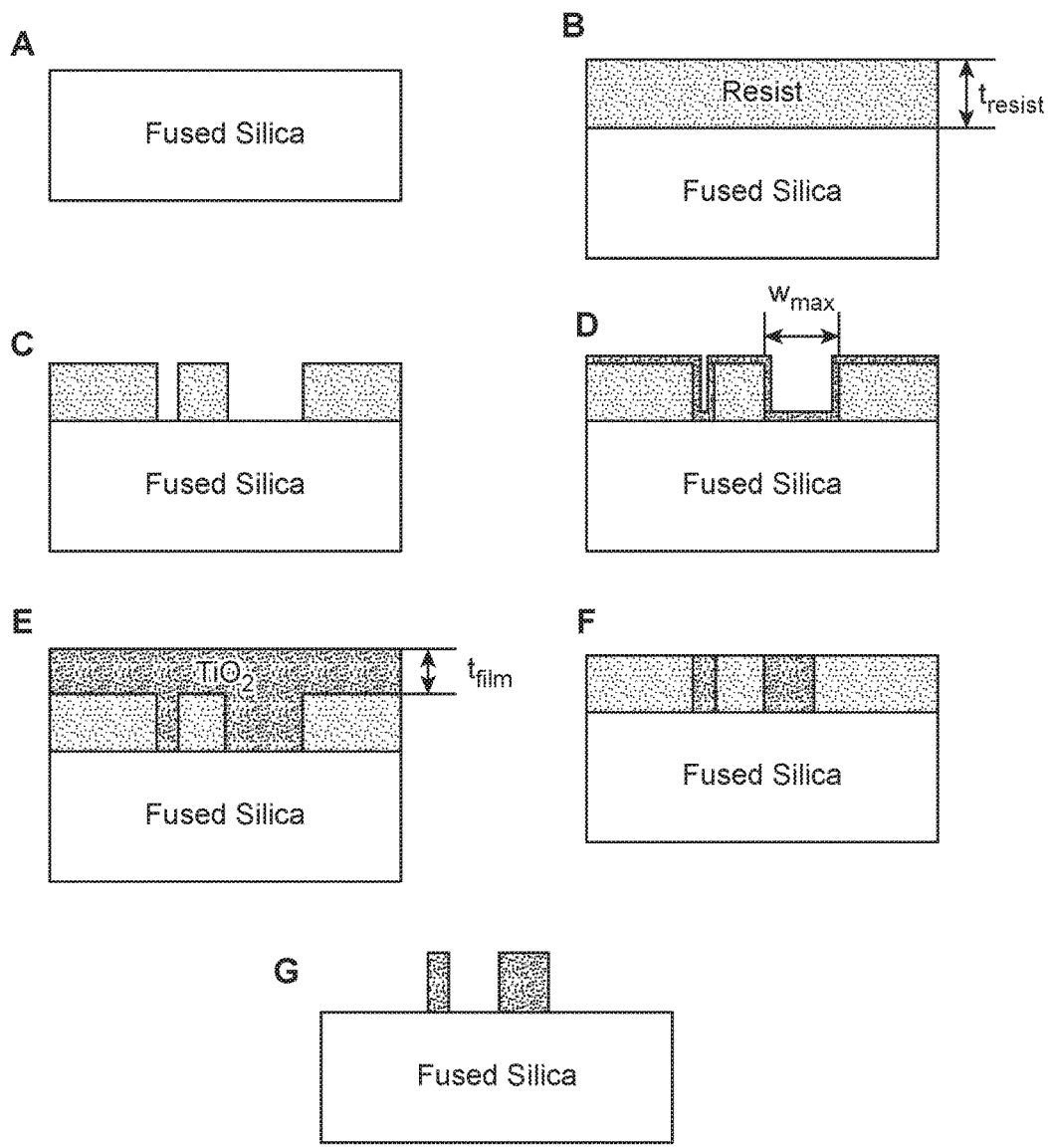
FIG. 1. Fabrication process for forming a visible spectrum dielectric metasurface based on atomic layer deposition (ALD).

Metasurfaces encompass artificial, near-flat or planar materials composed of units that provide control over a phase and a polarization of an optical field, where dimensions of the metasurface units are subwavelength within a spectrum of interest. Unlike traditional optical components such as lenses and polarizers, in which changes in electromagnetic field wavefronts occur as the electromagnetic field propagates over distances of several wavelengths, metasurfaces can introduce changes in phase and polarization within subwavelength distances. For example, transmissive dielectric metasurfaces, which are composed of subwavelength-spaced dielectric units and have near-flat profiles compared with refractive optics, can provide control over optical wavefronts while circumventing Ohmic losses associated with plasmonic metasurfaces.

Described according to some embodiments of this disclosure are dielectric metasurfaces which provide a gradual phase change over a subwavelength or a wavelength-comparable distance. This is in contrast to plasmonic metasurfaces, which introduce an abrupt change in phase.

Metasurfaces including dielectric units according to some embodiments further provide several advantages over metallic metasurfaces, such as greater scattering cross section, lower loss, improved transmission and reduction of undesired polarization conversion.

A metasurface including dielectric units is referred to generally herein as a dielectric metasurface (DM). DMs can expand on the effects of traditional optical components, providing unprecedented control over optical wavefronts, as well as providing for design and implementation of near-flat and compact optical components, a technologically-important advancement in optics.

While a DM has several advantages over a metallic metasurface and traditional optical components, and has potential for use in several applications, there has been an important hurdle to overcome with DMs: implementation for use in the visible spectrum encompassing wavelengths in a range of about 400 nanometers (nm) to about 700 nm. For example, DMs may be highly lossy in the visible spectrum when fabricated using silicon. Materials and fabrication techniques are desired to extend the use of DMs into the technologically-important visible spectrum while maintaining a high efficiency. Some desirable characteristics of DMs for the visible spectrum include one or more of the following: (1) a high index of refraction at visible wavelengths to ensure strong confinement of light propagating through dielectric units and thus realize a desired phase change of an exiting wavefront, and to decrease device size, (2) broadband transparency (e.g., low material absorption) over the visible spectrum, (3) smooth surfaces, and (4) high aspect ratio dielectric units, where an aspect ratio is specified as a ratio of a dimension of a dielectric unit along its long axis (e.g., a height along a direction substantially perpendicular to a surface of a substrate over which the dielectric unit is disposed) and a dimension of the dielectric unit along its short axis or an axis substantially perpendicular to the long axis (e.g., a width or a diameter along a direction substantially parallel to the surface of the substrate). A DM suitable for use in the visible spectrum, or a material selected for the DM, may possess one or more of the mentioned desirable characteristics, but may also omit one or more of the mentioned desirable characteristics.

Some embodiments are directed to a fabrication process using atomic layer deposition (ALD) that provides for the formation of high efficiency, visible spectrum DMs having the desirable characteristics mentioned above. The fabrication process can implement cleanroom process operations such as lithography and reactive ion etching, reproducibly providing deep subwavelength dielectric units with desired geometries and low loss in the visible spectrum. Because the fabrication process uses ALD, different dielectric materials can be used to create a DM. For example, metal and non-metal oxides (such as an oxide of aluminum (e.g., $Al_2O_3$), silicon (e.g., $SiO_2$), hafnium (e.g., $HfO_2$), zinc (e.g., ZnO), magnesium (e.g., MgO), or titanium (e.g., $TiO_2$)), metal and non-metal nitrides (such as nitrides of silicon (e.g., $Si_3N_4$), boron (e.g., BN), or tungsten (e.g., WIN)), metal and non-metal sulfides, and pure elements can be deposited via ALD. In accordance with ALD, one or more deposition cycles can be performed by sequentially exposing a substrate, or a portion of the substrate, to deposition gases of chemical precursors or reactants. The precursors react and form at least a partial layer of a dielectric material on the substrate during a deposition cycle, and further deposition cycles can be performed until a desired thickness is attained. Composite coatings of different dielectric materials also can be formed using ALD.

In accordance with some example embodiments, titanium dioxide ($TiO_2$) is selected due to its high refractive index and low loss in the visible spectrum, but the fabrication process can use other dielectric materials, such as other dielectric materials selected depending on a desired end application.

Figure 4:
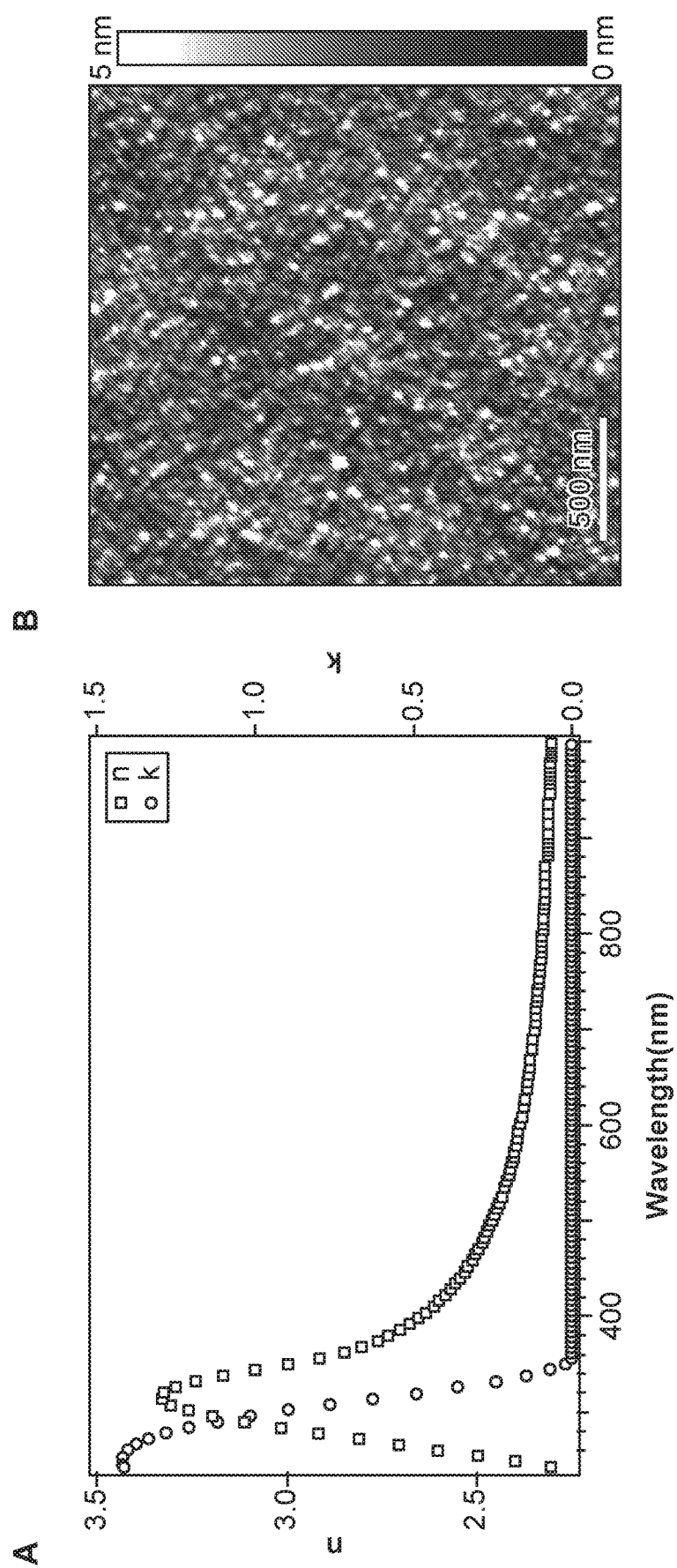
FIG. 4. Amorphous titanium dioxide material properties. (A) Measured real part (squares) and imaginary part (circles) of the refractive index (n and k) as a function of wavelength. The full set of ellipsometry data used in obtaining these optical functions is included in the Example section. (B) Atomic force microscope image of a typical $TiO_2$ film deposited via ALD. The film is an atomically smooth surface with root mean square (RMS) roughness of about 0.738 nm.

FIG. 4A provides a plot of optical properties of a $TiO_2$ film in a wavelength range from ultraviolet (UV) (about 243 nm) to near-infrared (about 1,000 nm). Optical properties of a material can be characterized by its complex refractive index, $\tilde{n}=n+ik$. The real part, n, represents phase accumulation in the material and is a refractive index (or an index of refraction), while the imaginary part, k, is related to optical absorption in the material. As can be seen from FIG. 4A, the as-deposited $TiO_2$ film has some loss (optical absorption) in the UV portion of the spectrum; however, from about 360 nm, the loss drops below a detection threshold of a measurement instrument and stays below that threshold up to the longest tested wavelength of about 1,000 nm. Of note, the refractive index of $TiO_2$ is high throughout the visible range, ranging from about 2.6 at about 400 nm to about 2.3 at about 700 nm. This allows for strong confinement of light and enhanced phase accumulation within a reduced thickness of an optical component including a visible spectrum DM formed from $TiO_2$. Other suitable dielectric materials include those having values of k of no greater than about 0.2, no greater than about 0.15, no greater than about 0.1, no greater than about 0.05, or no greater than about 0.01, over the visible spectrum or a design or working wavelength in the visible spectrum, and having values of n of at least about 1.5, at least about 1.8, at least about 2, at least about 2.1, at least about 2.3, or at least about 2.5, over the visible spectrum or the design or working wavelength in the visible spectrum. Suitable dielectric materials that are transparent in the visible spectrum can have a light transmittance of at least about 40%, at least about 50%, at least about 60%, at least about 70%, at least about 80%, at least about 85%, at least about 90%, or at least about 95%, over the visible spectrum or a design or working wavelength in the visible spectrum.

FIG. 1 shows a fabrication process for forming a visible spectrum DM based on a conformal chemical vapor deposition approach such as ALD, according to some embodiments. The process begins (FIG. 1a) with providing a substrate that is transparent in the visible spectrum, such as shown, by way of example, as one including fused silica. Suitable substrates that are transparent in the visible spectrum can have a light transmittance of at least about 40%, at least about 50%, at least about 60%, at least about 70%, at least about 80%, at least about 85%, at least about 90%, or at least about 95%, over the visible spectrum or a design or working wavelength in the visible spectrum.

Next, a resist (e.g., an electron beam resist or a photoresist) is applied (FIG. 1b) to the substrate by spinning at a particular rate to set a thickness, $t_{resist}$, of a resulting resist layer. The thickness of the resist layer is a parameter which sets a height of resulting dielectric units in the fabricated DM, contributes to a phase of an exiting light, and affects an efficiency of the DM. In general, the spin rate and a viscosity of the resist can be controlled to adjust the thickness of the applied resist layer. As an example, a spin rate of about 5,000 rpm (revolutions per minute) while applying an electron beam resist of a particular viscosity results in a thickness of a resist layer of about 400 nm.

Next, the resist layer is exposed (e.g., using electron beam lithography or photolithography) and developed (FIG. 1c), forming an inverse pattern for forming the dielectric units. A resulting patterned resist layer is formed with, or defines, gaps, openings, or recesses exposing portions of a surface of the substrate. The openings can have an aspect ratio greater than about one, such as at least about 1.5:1, at least about 2:1, at least about 3:1, at least about 4:1, or at least about 5:1, and up to about 10:1 or greater, or up to about 20:1 or greater.

Next, ALD is performed to deposit (FIG. 1d) a film of a dielectric material over the patterned resist layer and the exposed portions of the surface of the substrate. A feature of ALD exploited in the fabrication process to achieve high aspect ratio dielectric units with smooth surfaces is the conformal nature of the film as it is deposited. As shown in FIG. 1d, top and sidewall surfaces of the patterned resist layer and the exposed portions of the surface of the substrate are conformally coated by the dielectric material using ALD. Thus, the film takes on a shape of the openings in the patterned resist layer. For example, an opening having substantially vertical sidewalls (e.g., substantially perpendicular to a respective exposed portion of the surface of the substrate within the opening) results in a dielectric unit having substantially vertical sidewalls, which allow precise control over a phase of an exiting wavefront with reduced phase errors. By way of comparison, top-down etching techniques can introduce sloped sidewalls, which can lead to phase errors. Further, the conformal coating provides for dielectric units having exceptionally smooth surfaces so as to reduce losses from scattering, such as having a root mean square (RMS) surface roughness of no greater than about 20 nm, no greater than about 15 nm, no greater than about 10 nm, no greater than about 5 nm, no greater than about 4 nm, no greater than about 3 nm, no greater than about 2 nm, or no greater than about 1 nm. By way of comparison, top-down etching techniques can result in undesired sidewall roughness, which can lead to scattering losses.

In accordance with ALD, a first ALD cycle is performed to deposit the dielectric material over the substrate held or housed within a deposition chamber, followed by performing a second ALD cycle to deposit the dielectric material over the substrate, followed by performing a third ALD cycle to deposit the dielectric material over the substrate, and so on until a desired amount of the dielectric material is deposited. In some embodiments, performing each ALD cycle includes exposing the substrate to deposition gases of chemical precursors or reactants. In the case of $TiO_2$ as the dielectric material, a first precursor is a titanium-containing precursor, such as an organometallic compound of titanium, and the second precursor is an oxygen-containing precursor. The first precursor and the second precursor react and form at least a partial layer of the dielectric material over the patterned resist layer and the exposed portions of the surface of the substrate. Accordingly, ALD is used to successively deposit additional dielectric material of the film in a layer-by-layer fashion until the film fills the openings in the patterned resist layer (FIG. 1e). Each deposited layer conformally coats a previously deposited layer.

In the fabrication process of some embodiments, a temperature of the ALD cycles, $T_{ALD}$, (FIG. 1d-e) is controlled to be lower than that used for ALD in other contexts. For example, in other contexts, ALD can be used to deposit films at about 150° C. or higher; however, for certain resists, temperatures above about 115° C. can cause a resist to reflow so that a resist pattern deteriorates. Thus, for the ALD cycles (FIG. 1d-e), the temperature is controlled or maintained below about 115° C., such as about 110° C. or below, about 105° C. or below, about 100° C. or below, or about 90° C.

In some embodiments, an amount of the dielectric material deposited in the ALD cycles (FIG. 1d-e) is a function of a maximum desired feature size (e.g., a feature width or diameter) of a dielectric unit (e.g., $w_{max}$ in FIG. 1d). Depending on the pattern of the resist layer, the dielectric film may be deposited to a thickness, $t_{film}$, over the patterned resist layer to achieve the maximum desired feature size. For example, as illustrated in FIG. 1e, to obtain a feature width $w_{max}$ in an opening of the patterned resist layer, $t_{film} \geq w_{max}/2$, and a top surface of the dielectric film is above the top surface of the patterned resist layer. In some embodiments, $t_{film}$ is at least about 50 nm greater than $w_{max}/2$. It is noted that the thickness $t_{film}$ corresponds to an amount of the deposited dielectric material that would cover a planar surface with an uniformly thick film of the dielectric material having the thickness $t_{film}$, and corresponds a thickness of a top portion of the dielectric film deposited over the top surface of the patterned resist layer and extending over the openings of the patterned resist layer.

Next, blanket etching is performed to remove the top portion of the dielectric film and expose (FIG. 1f) the top surface of the patterned resist layer and top surfaces of resulting dielectric units disposed in the openings of the patterned resist layer. For example, reactive ion etching may be used, such as using a mixture of $Cl_2$ gas and $BCl_3$ gas, to remove the top portion of the dielectric film to an etch depth substantially equal to the thickness $t_{film}$, although an etch depth greater than the thickness $t_{film}$ is also contemplated, such as including removing a top portion of the patterned resist layer via an etch depth of $t_{film}$+about 10 nm. In such fashion, excess dielectric film is removed, and the patterned resist layer (or a residual thereof) is exposed.

The patterned resist layer is removed (FIG. 1g) by exposing to a resist removal solvent, leaving high aspect ratio dielectric units of the DM over the substrate, and having an aspect ratio greater than about one, such as at least about 1.5:1, at least about 2:1, at least about 3:1, at least about 4:1, or at least about 5:1, and up to about 10:1 or greater, or up to about 20:1 or greater.

Figure 2:
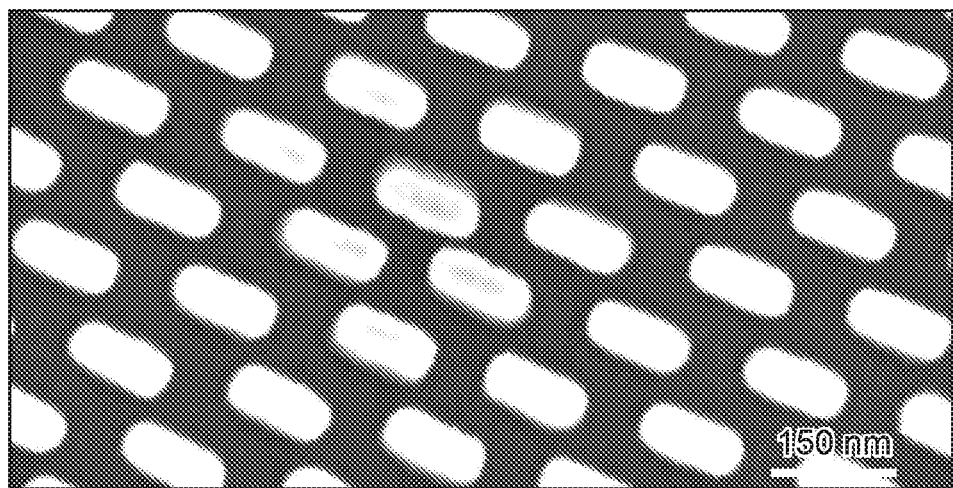
FIG. 2. Scanning electron microscope images of fabricated structures. (A) Top view of dielectric units. (B) Tilted view of the dielectric units.
Figure 2:
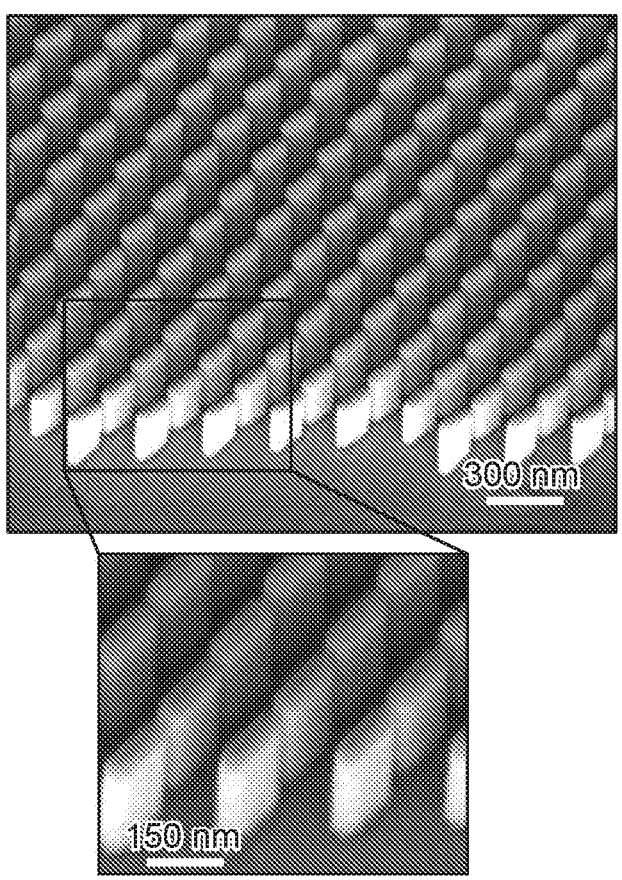

FIG. 2a-b shows scanning electron microscope (SEM) images of dielectric units formed using the fabrication process of some embodiments of this disclosure. As illustrated in FIG. 2a, the fabrication process can produce arbitrary nanostructures such as nanopillars or nanofins of varying widths, and can attain such widths on a visible spectrum subwavelength scale. The resulting nanostructures are anisotropic with sidewalls substantially perpendicular to a surface of a substrate, as shown in FIG. 2b providing a 30 degree tilted view of the nanostructures in FIG. 2a. A feature width down to about 25 nm on an about 75 nm pitch (center-to-center spacing between adjacent dielectric units), with a height of the dielectric units from about 100 nm to about 500 nm, can be attained by way of example. Further feature width reduction can be attained with the fabrication process of some embodiments of this disclosure. For example, dielectric units with widths of about 10 nm or less are encompassed by this disclosure. Dielectric units with high aspect ratios can be attained with the fabrication process. For example, dielectric units with heights up to about 500 nm or greater or up to about 1,000 nm or greater can be attained. In some embodiments, widths of dielectric units are less than a design wavelength of incident light in the visible spectrum, such as no greater than about 400 nm, no greater than about 300 nm, no greater than about 200 nm, no greater than about 150 nm, no greater than about 100 nm, no greater than about 50 nm, about 50 nm to about 200 nm, or about 25 nm to about 200 nm. In some embodiments, dielectric units can have generally rectangular or other elongated cross-sections (along or projected onto a plane parallel to a surface of a substrate over which the dielectric units are disposed) having a width and a length, and where the length is greater than the width, and the length and the width are less than a design wavelength of incident light in the visible spectrum, such as no greater than about 400 nm, no greater than about 300 nm, no greater than about 200 nm, no greater than about 150 nm, no greater than about 100 nm, no greater than about 50 nm, about 50 nm to about 200 nm, or about 25 nm to about 200 nm. In some embodiments, dielectric units can have generally circular cross-sections or other even rotationally symmetric cross-section (along or projected onto a plane parallel to a surface of a substrate over which the dielectric units are disposed) having a diameter, and the diameter is less than a design wavelength of incident light in the visible spectrum, such as no greater than about 400 nm, no greater than about 300 nm, no greater than about 200 nm, no greater than about 150 nm, no greater than about 100 nm, no greater than about 50 nm, about 50 nm to about 200 nm, or about 25 nm to about 200 nm. In some embodiments, a pitch of adjacent dielectric units is less than a design wavelength of incident light in the visible spectrum, such as no greater than about 400 nm, no greater than about 300 nm, no greater than about 200 nm, no greater than about 150 nm, no greater than about 100 nm, no greater than about 50 nm, about 50 nm to about 200 nm, or about 25 nm to about 200 nm. In some embodiments, dielectric units can have substantially consistent widths or diameters along their long axes, such that a width or diameter at a top end of a dielectric unit is substantially the same as a width or diameter at a bottom end of the dielectric unit. It is noted that the above-mentioned dimensions are also applicable for openings of a patterned resist layer within which dielectric units are formed during the fabrication process of some embodiments.

Figure 3:
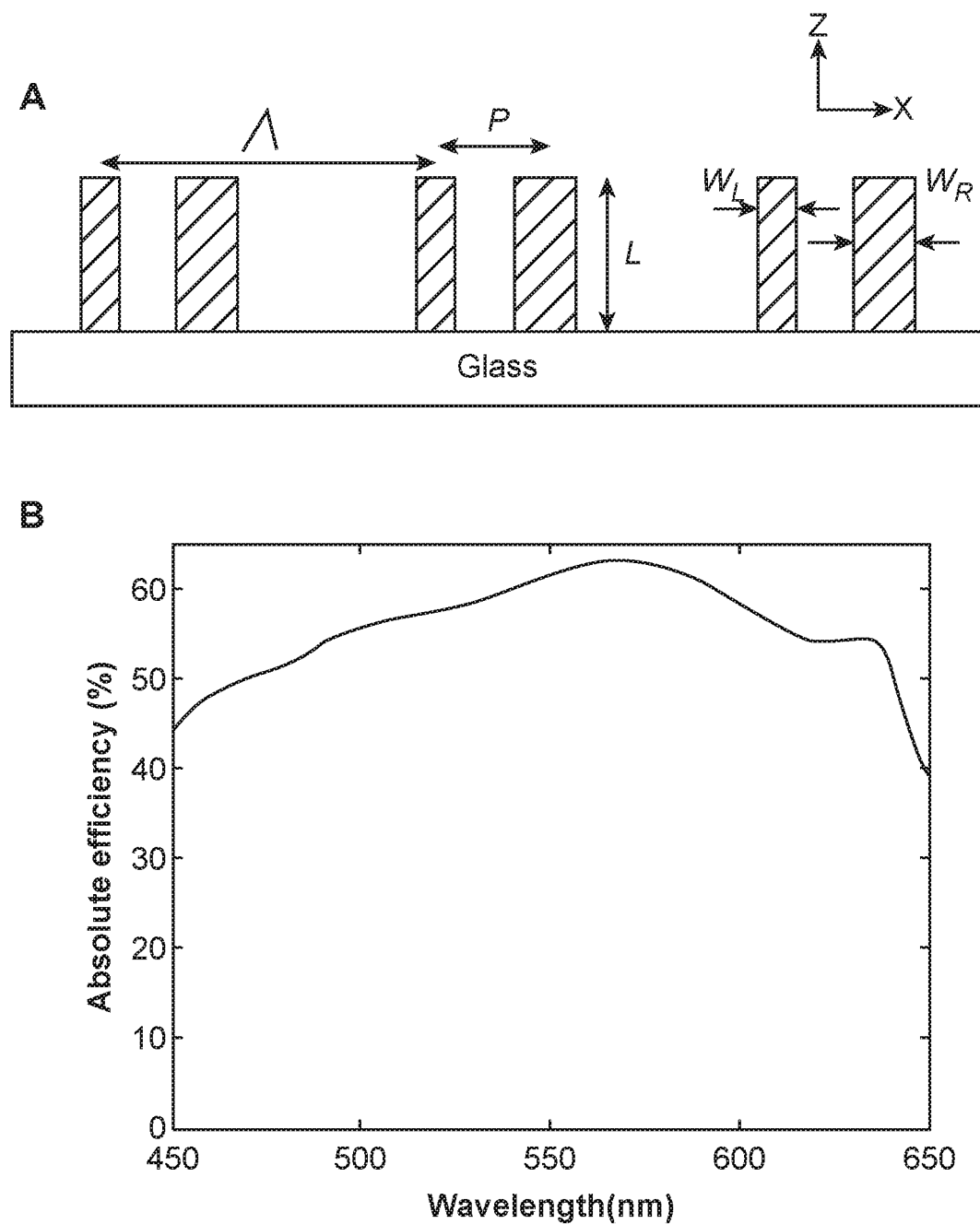
FIG. 3. Broadband efficient meta-grating in the visible spectrum. (A) Schematic representation of the meta-grating. (B) Simulation results for the meta-grating.

FIG. 3a shows a representation of a broadband efficient meta-grating in the visible spectrum, showing the versatility of optical components that can be formed using the fabrication process of some embodiments of this disclosure. The meta-grating includes multiple (here, three) dielectric ridge waveguides (DRWs) over a glass substrate, each DRW including at least one dielectric unit of width $W_L$=about 50 nm and at least one dielectric unit of width $W_R$=about 140 nm greater than $W_L$, each dielectric unit having a height L=about 300 nm, each DRW having a center-to-center distance between dielectric units of P=about 350 nm, and a DRW meta-grating period Λ=about 1,300 nm. As shown in simulation results in FIG. 3b, an absolute efficiency of greater than about 50% is achieved over much of the visible spectrum, where the absolute efficiency is specified for the results in FIG. 3b as a ratio of transmitted power of light in the +1 order to an input power of light.

More generally, an absolute efficiency of an optical component including a DM of some embodiments can be specified as a ratio of transmitted power of light having a designed property of the optical component to an input power of light, and the absolute efficiency can be greater than about 50% over the visible spectrum, or a design or working wavelength in the visible spectrum, such as at least about 55%, at least about 60%, at least about 65%, at least about 70%, or at least about 75%, and up to about 80% or greater, or up to about 85% or greater.

Although the fabrication process of some embodiments has been discussed with respect to metasurfaces, the fabrication process can be used more generally to form high performance photonics components such as photonic crystals and waveguides.

Example

The following example describes specific aspects of some embodiments of this disclosure to illustrate and provide a description for those of ordinary skill in the art. The example should not be construed as limiting this disclosure, as the example merely provides specific methodology useful in understanding and practicing some embodiments of this disclosure.

Overview: Metasurfaces encompass planar optical components that can overcome the constraints of refractive and diffractive optics. Dielectric metasurfaces are typically constrained to transparency windows at infrared wavelengths because of significant optical absorption and loss at visible wavelengths. Thus, it is desired that materials and nanofabrication techniques be developed to extend dielectric metasurfaces across the visible spectrum and to allow applications such as high numerical aperture lenses, color holograms, and wearable optics. Here, this example demonstrates high performance dielectric metasurfaces in the form of holograms for red, green, and blue wavelengths with high absolute efficiency (>about 78%). Atomic layer deposition of amorphous titanium dioxide is performed to attain surface roughness of less than about 1 nm and negligible optical loss. A process for fabricating dielectric metasurfaces is used which allows anisotropic, subwavelength-spaced dielectric nanostructures to be produced with shape birefringence. This process is capable of realizing various high efficiency metasurface optical components, such as metal-enses and axicons.

Results and Discussion: In this example, demonstration is made of amorphous $TiO_2$ metasurfaces that maintain high efficiency across the entire visible spectrum. An approach to creating transmissive dielectric metasurfaces (DMs) uses a bottom-up nanofabrication process via atomic layer deposition providing high aspect ratio, anisotropic dielectric nanostructures with reduced surface roughness. As proof of concept that control of a phase of a wavefront from 0 to $2\pi$ can be attained, a condition for many optical components, metasurface holograms are produced based on geometric phase. Efficient metasurfaces with metallic components operating in reflection have been demonstrated at red and near-infrared wavelengths but have efficiencies of <1% and <10% at blue and green wavelengths, respectively. Thus, the $TiO_2$ metasurfaces demonstrated here provide substantial improvement with efficiencies from about 78 to about 82%. Additionally, the use of a dielectric material allows the devices to function in transmission with high efficiency, which is condition for many optical components.

The ability to realize high efficiency dielectric metasurfaces can be dependent on optical properties of a constituent material, as characterized by its complex refractive index, ñ=n+ik. The material should have negligible absorption loss (e.g., k≈0) with a relatively high refractive index (e.g., n>about 2) at visible wavelengths. Although a negligible absorption is a condition for high transmission efficiency, a high refractive index ensures strong confinement of light, which allows full control over a phase of an exiting wavefront (phase changes from 0 to 2π). The material should be optically smooth, having a surface roughness that is much smaller than a wavelength of light. High surface roughness introduces extraneous light scattering, which can be a significant source of loss. To reduce roughness, the material should be amorphous or single-crystalline, as grain boundaries in polycrystalline materials can increase roughness and act as light scattering centers.

$TiO_2$ is selected as a base material because it has a transparency window (k≈0) for wavelengths longer than about 360 nm and its inter-band transition lies just outside of the visible spectrum, resulting in a sufficiently high index of refraction for strong light-matter interactions. $TiO_2$ is deposited by atomic layer deposition (ALD) at about 90° C. with tetrakis(dimethylamido)titanium (TDMAT) as a precursor due to its high deposition rate and absence of defect-driven absorption that may occur with $TiCl_4$-based precursors. Additionally, use of an ALD process offers several advantages. ALD is a self-limiting process providing conformal coverage and monolayer control of a film thickness. The conformal nature of the technique is desirable to produce high aspect ratio nanostructures. The uniform and monolayer coverage yields smooth films with reduced defects compared to those prepared via sputtering or evaporation. Furthermore, the ALD process allows precise control of a material phase of the deposited $TiO_2$, producing amorphous, rutile, or anatase films, depending on the deposition temperature.

Characterization of the optical properties of the amorphous $TiO_2$ shows that it is a desirable material for DMs. FIG. 4A shows measured optical properties of a $TiO_2$ film from UV (about 243 nm) to near-infrared (about 1,000 nm) wavelengths. To extract the $TiO_2$ optical properties from the collected data, a Tauc-Lorentz (TL) oscillator model developed for amorphous materials is used. Over the visible spectrum, the refractive index ranges from about 2.63 to about 2.34 and remains relatively flat between λ=about 500 nm and λ=about 750 nm (Δn=about 0.09). Below the wavelength of about 500 nm, the index of refraction increases rapidly, implying the approach of an electronic transition. For wavelengths shorter than about 360 nm, the imaginary part of the refractive index, k, begins to take on nonzero values, a result of inter-band absorption. From the ellipsometry data and corresponding TL model, the bandgap, $E_g$, is determined to be about 3.456 eV (the full set of fitting parameters (Table 1) and raw ellipsometry data (FIG. 8) are included below). This value of the bandgap is in good agreement with previously reported values for amorphous $TiO_2$.

Figure 9:
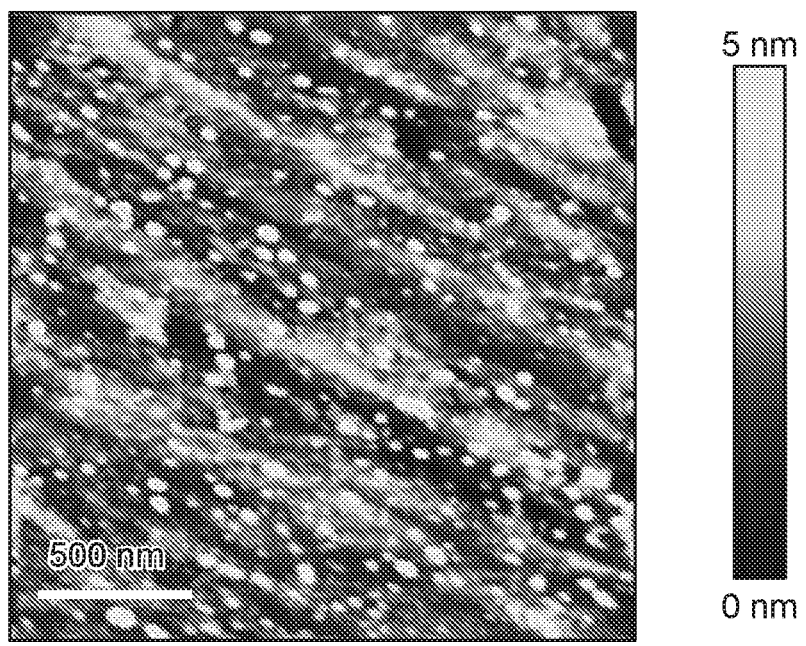
FIG. 9. Atomic force microscope image of a bare glass substrate with a root mean square roughness of about 0.698 nm.
Figure 10:
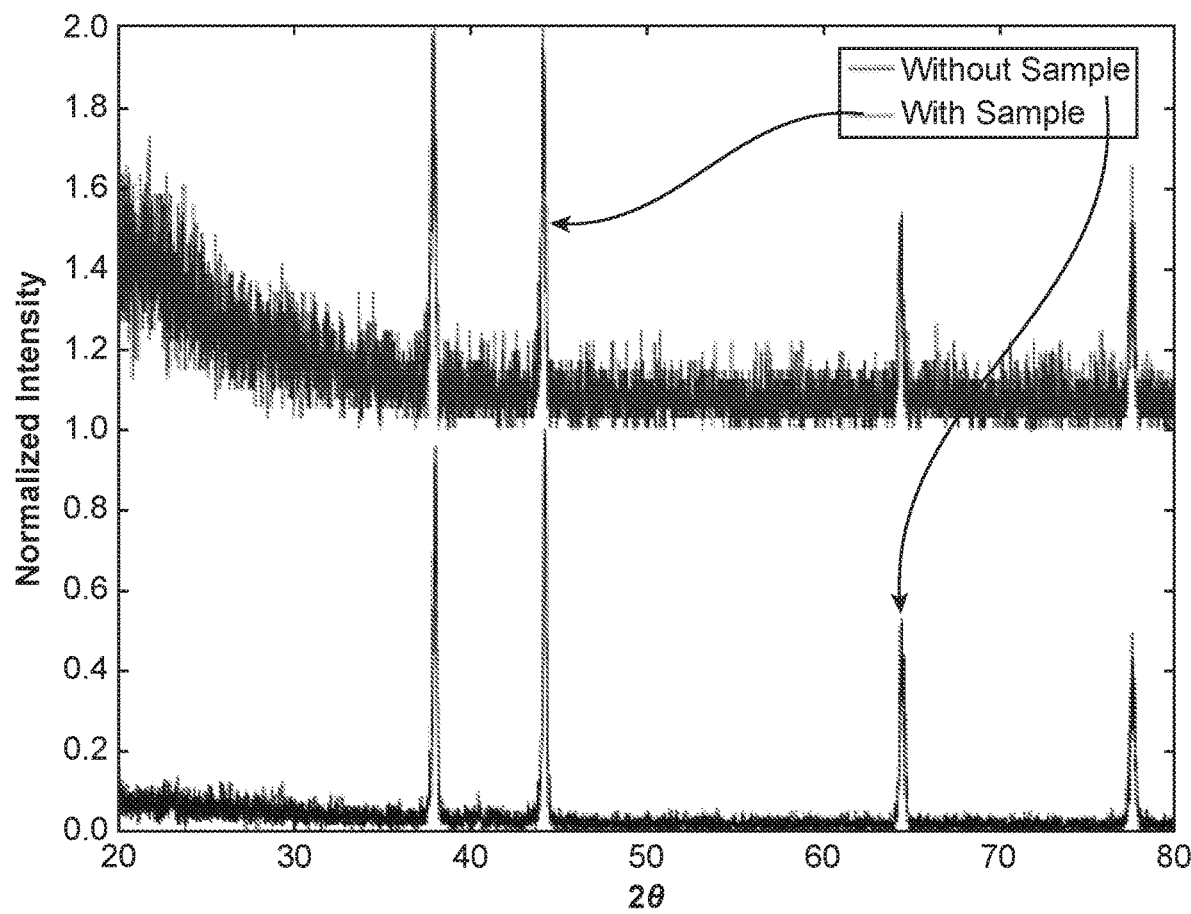
FIG. 10. X-ray diffraction of ALD $TiO_2$. There are no observable diffraction peaks from any $TiO_2$ polymorphs. The peaks that appear in the scan result from the X-ray diffraction stage as can be seen from comparing the scan with (top) and without (bottom) the sample.

The $TiO_2$ films also exhibit surface roughness that is much smaller than the incident wavelength, as characterized by atomic force microscopy (AFM). FIG. 4B shows an AFM scan of a typical $TiO_2$ film deposited on a fused silica substrate. The scan has a root mean square (RMS) roughness of about 0.738 nm, which is on the order of the surface roughness of the underlying substrate (FIG. 9). Due to the absence of grain boundaries verified by AFM, coupled with the X-ray diffraction data (FIG. 10), it can be concluded that the material is amorphous. The measured roughness of the amorphous $TiO_2$ is an order of magnitude less than other phases such as polycrystalline rutile or anatase. The latter two phases generally have grain boundaries and RMS roughness as high as about 5-10 nm, both of which contribute to light-scattering loss.

Figure 5:
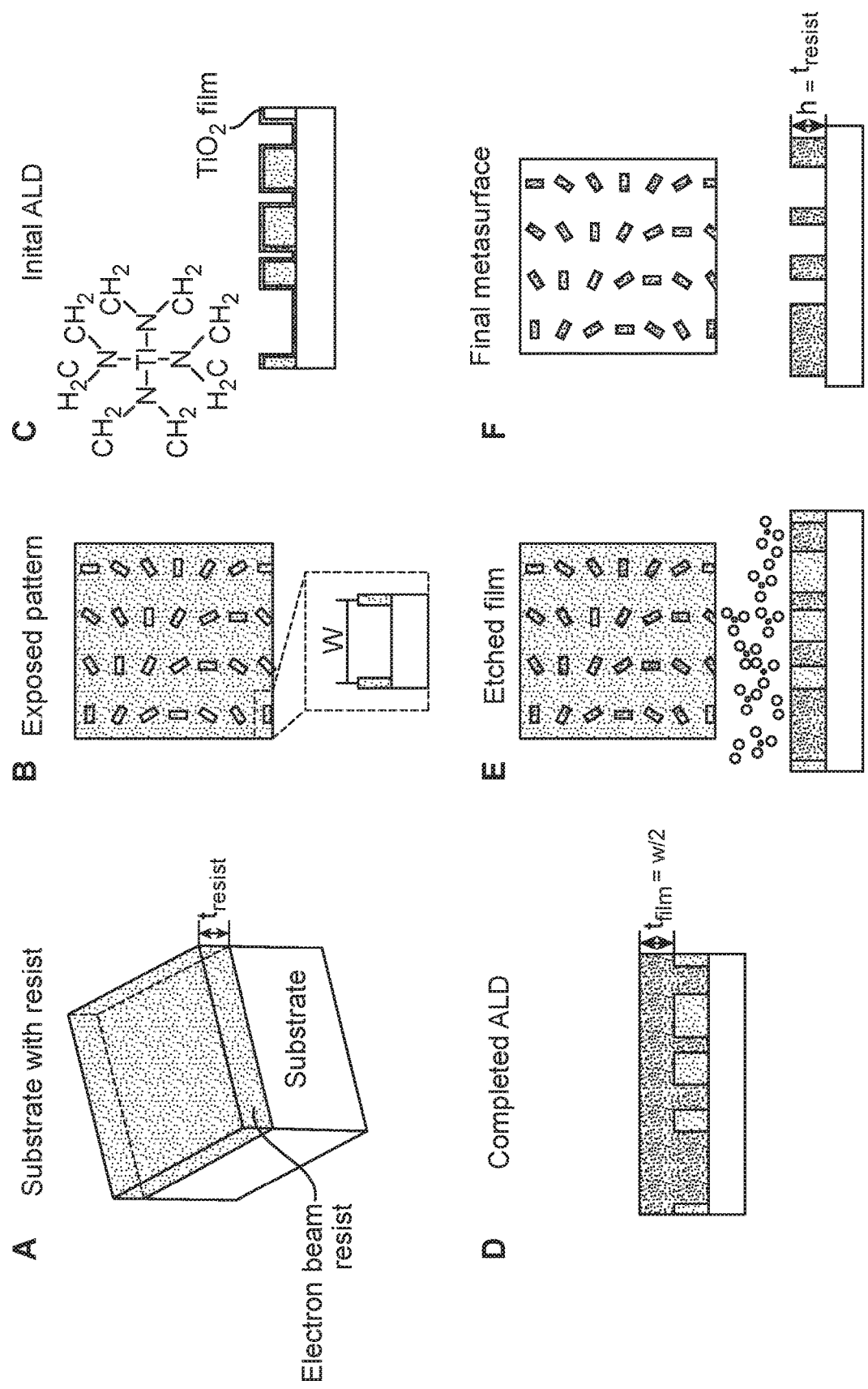
FIG. 5. Fabrication process for dielectric metasurfaces. (A) Electron beam resist (EBR) on fused silica (or other transparent substrate) with thickness $t_{resist}$ that ultimately sets a height of a final structure (perspective view) (B) Inverse of a final metasurface pattern imprinted into the EBR by electron beam lithography and subsequent development of the pattern (top view). The boxed area is an expanded cross-section of a maximum feature width, w. (C) Initial $TiO_2$ deposition via ALD conformally coats sidewalls and top of the EBR and exposed substrate (side view). Tetrakis(dimethylamido)titanium (TDMAT) molecule used for ALD is also shown. (D) Completed deposition of the $TiO_2$ yields a film thickness greater than half the width of the maximum feature size, $t_{film} \geq w/2$. (E) Exposed tops of the $TiO_2$ metasurface and residual EBR after reactive ion etching with a mixture of $Cl_2$ and $BCl_3$ ions (top and side view). (F) Final dielectric metasurface after removal of remaining EBR (top and side view).

To achieve highly efficient metasurface devices while preserving the optical properties of ALD-prepared $TiO_2$, the fabrication process shown in FIG. 5 is used. An electron beam resist (EBR) is spun onto a fused silica substrate to produce a layer with thickness, $t_{resist}$ (FIG. 5A). Control of $t_{resist}$ is desired because it sets a height of final nanostructures. The resist is patterned using electron beam lithography and is subsequently developed in solution to remove the exposed EBR. This pattern is the inverse of a final metasurface (FIG. 5B). The exposed sample is transferred to an ALD chamber set to about 90° C. The purpose of this temperature is twofold: It produces the desired amorphous phase and keeps the EBR below its glass transition temperature (e.g., prevents deterioration of nanoscale patterns). During the deposition, the gaseous $TiO_2$ precursor (TDMAT) coated substantially all exposed surfaces, producing a conformal film on top and sidewalls of the EBR as well as on the exposed fused silica substrate (FIG. 5C). The ALD process is allowed to reach a specific thickness such that all features are completely filled with $TiO_2$. Because the conformal ALD process fills exposed features from both sides, the total ALD film thickness is $t_{film} \geq w/2$, where w is a maximum width of all gaps or recesses (FIG. 5D). In practice, the deposition is allowed to proceed well beyond the lower threshold of half the feature width to ensure that $TiO_2$ had sufficiently diffused into all pores and that there are no voids in the final nanostructures. The residual $TiO_2$ film that coats a top surface of the resist is removed by reactive ion etching the sample in a mixture of $BCl_3$ and $Cl_2$ gas (about 8:2), similar to a planarization technique. The etch depth was substantially equal to $t_{film}$ so that the etching process exposes the underlying resist and the top of the nanostructures (FIG. 5E). The remaining resist is removed to retain the nanostructures that form the metasurface (FIG. 5F). In this way, nanostructures of heights $t_{resist}$ are obtained while depositing a film of thickness $t_{film} \approx w/2$, which is time-saving and efficient.

This approach is different from liftoff techniques, which generally cannot be used due to a conformal coating of ALD films. In addition, creating high aspect ratio nanostructures via dry etching of $TiO_2$, similar to other dielectric materials, is difficult and can lead to increased sidewall roughness. This ALD process is also different from techniques where patterns created are generally fixed by a set template (e.g., anodic alumina or inverse opal). Here the ALD process allows flexibility to form more complex nanostructures because ALD is used directly on an exposed EBR.

Figure 6:
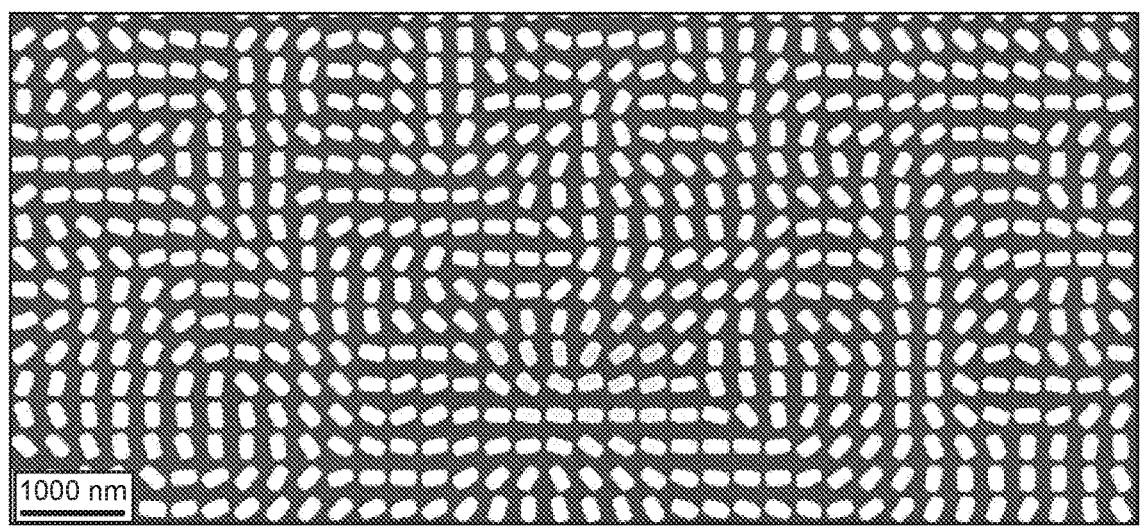
FIG. 6. Scanning electron microscope images of fabricated structures. (A) Large-scale view of a fabricated metasurface hologram composed of $TiO_2$ nanofins. (B) Zoomed top view of the metasurface showing individual nanofins. The fabricated nanofins are substantially free from residual resist and have dimensions ±10 nm of designed dimensions of 250 nm×85 nm. It can also be seen that, with this fabrication technique, gaps between structures as small as about 6 nm can be achieved. (C) Top view of structures with lateral dimensions of about 40 nm. (D) Cross-section (side view) of nanofins exhibiting vertical sidewalls with a height of about 600 nm. The oscillations in contrast between nanofins result from shadowing effects during deposition of a metal film used to prevent charging while imaging the samples.
Figure 6:
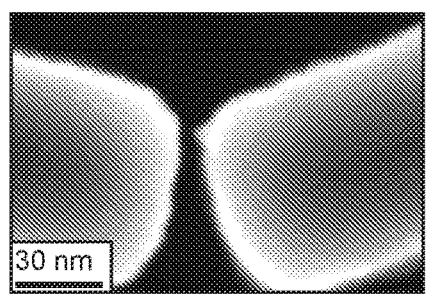
Figure 6:
Figure 6:
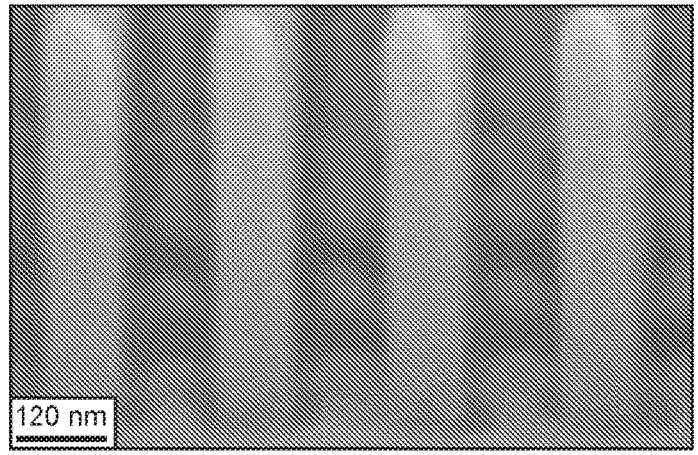

Investigation of structures, fabricated using the process above, shows that nanostructures (e.g., nanofins) can be formed with desired anisotropy and subwavelength dimensions. FIG. 6 shows scanning electron microscope (SEM) images of a fabricated metasurface hologram. As seen in FIG. 6A, large areas are densely patterned with subwavelength-spaced $TiO_2$ nanofins. This ultimately ensures that a majority of incident light is imprinted with a desired phase, higher diffraction orders are suppressed, and holographic images are produced with high efficiency. FIG. 6B shows an SEM image of the metasurface at high magnification, allowing resolution of individual nanofins. With this process, extremely small spacing between individual nanofins can be attained, as shown by an about 6-nm gap in FIG. 6B. The structures in this case have dimensions of 250 nm×90 nm, but the process also can produce structures with dimensions as small as about 40 nm (FIG. 6C).

Structures that deviate from about 90° sidewalls, taking on a more triangular cross-section, can introduce phase errors in a metasurface. Similarly, structures with large voids or defects can reduce an effective refractive index of nanofins. FIG. 6D shows a cross-section SEM image of the nanofins (vertical direction in the image is the direction of light propagation). It is observed that the angle of the nanostructures in the vertical direction is about 89°; that is, the nanostructures are highly anisotropic. This anisotropy is despite the fact that the nanostructures shown here are relatively tall compared with their other dimensions, with heights of about 600 nm. Similarly, no void formation is detected in the center of the nanofins. From the SEM images, it can also be seen that the final nanostructures have reduced top surface and sidewall roughness.

Figure 11:
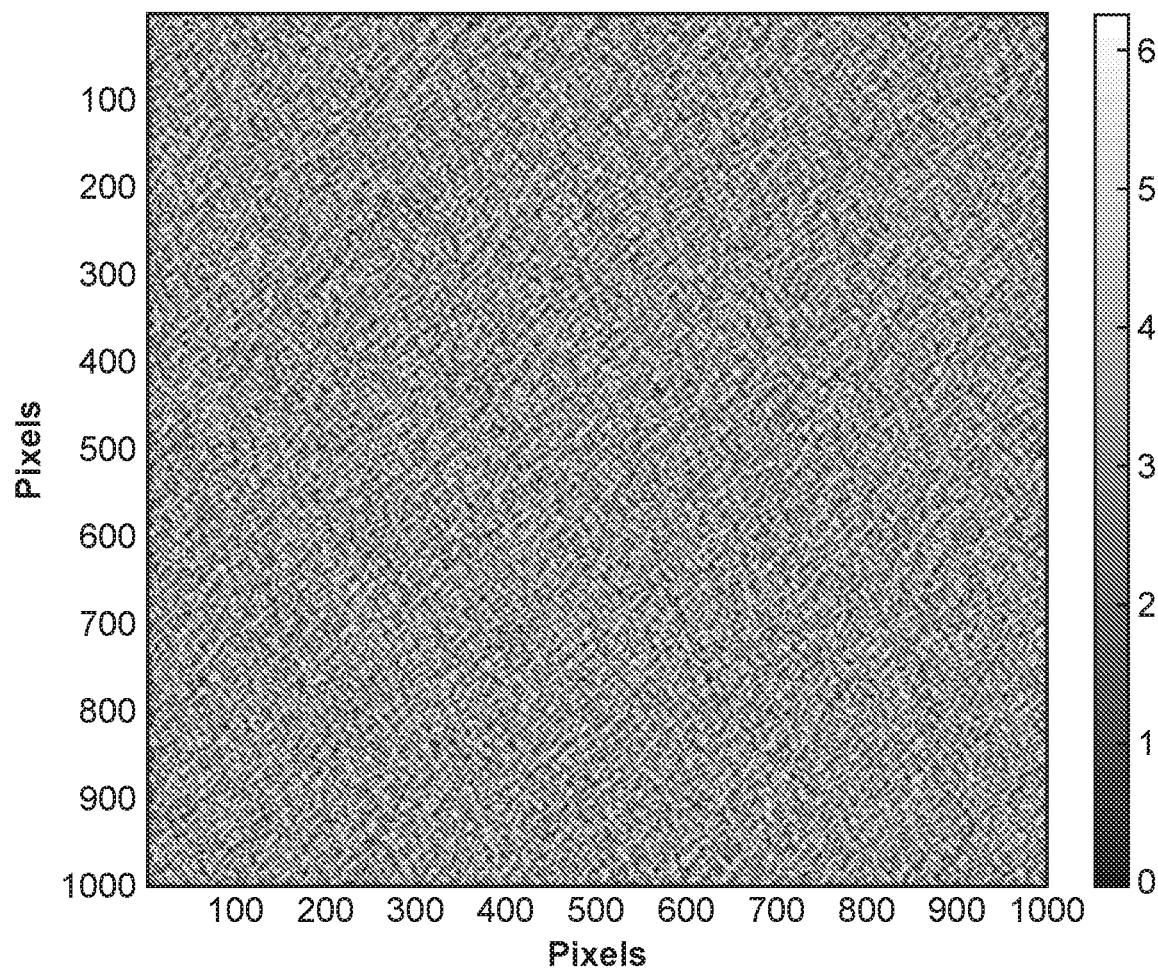
FIG. 11. Phase map of Harvard logo used to generate holograms for a design wavelength of about 480 nm. Inset shows a 150×150 pixel phase distribution. This phase information was translated to nanofin rotations.

To demonstrate the efficiency and functionality of $TiO_2$ metasurfaces, three metasurface holograms (metaholograms) are designed to have peak efficiencies at wavelengths of about 480, about 532, and about 660 nm. A desired phase via rotation of the birefringent $TiO_2$ nanofins is imparted as shown in FIG. 6, based on geometric or Pancharatnam-Berry (PB) phase. (See details below). An advantage of the PB phase is that the imparted phase is wavelength-independent (just the efficiency changes with wavelength), thus providing a desirable platform to test the performance of the metasurface over the entire visible range. The phase map of a holographic image, the binary Harvard logo, is computed by way of the Gerchberg-Saxton phase-retrieval technique (FIG. 11).

Figure 12:
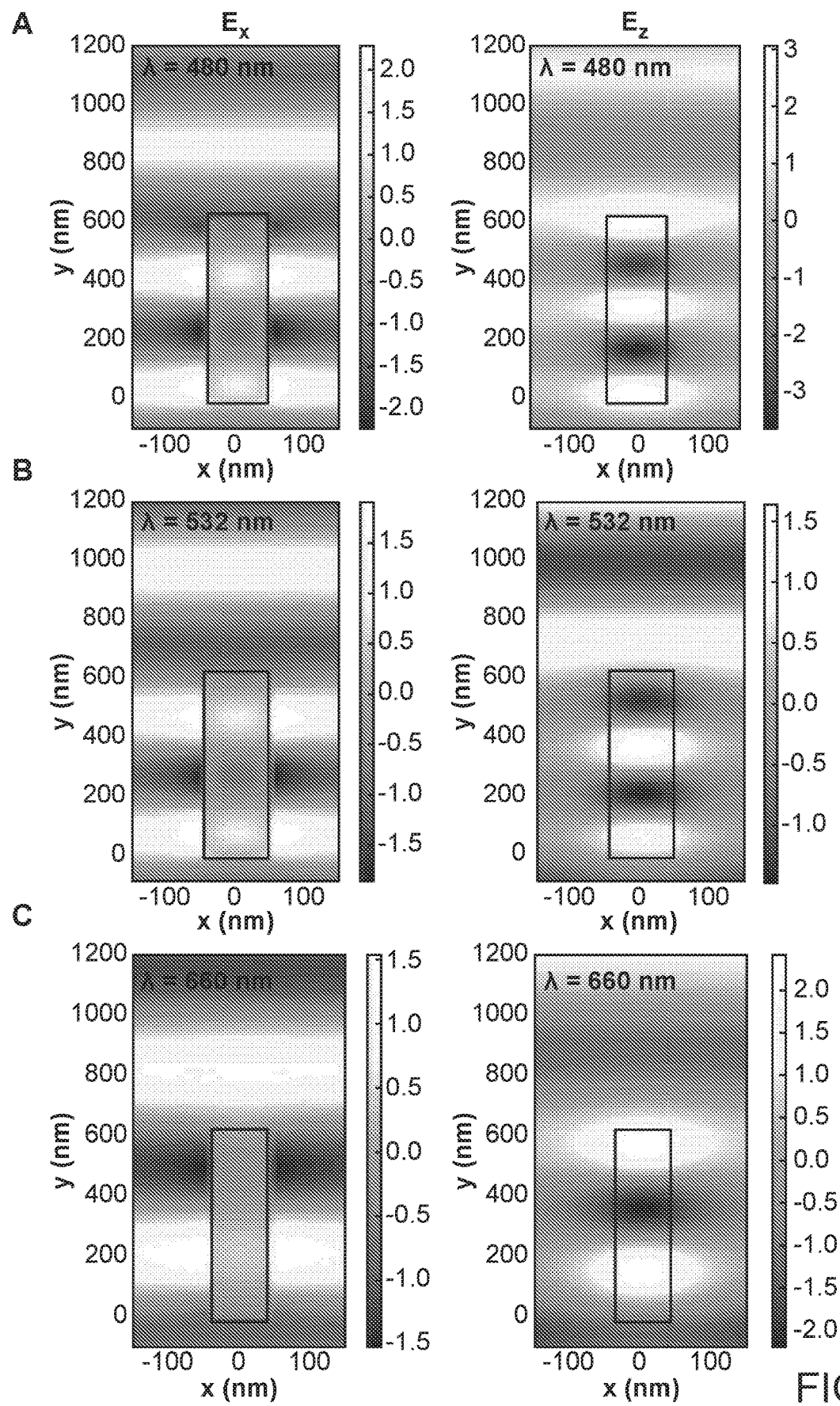
FIG. 12. Simulated electric field profiles at a design wavelength. Real part of the x component (Left) and z component (Right) of the electric field at design wavelengths (A) about 480 nm, (B) about 532 nm, and (C) about 660 nm. All fields are shown through a cross-section of the nanofin width, and the nanofin is highlighted in each panel with a black box. One can see that the x and z components of the electric fields exiting the pillar, at each wavelength, are out of phase by about $\pi$ radians, as specified for PB phase. The $TiO_2$ pillars are simulated on a glass substrate that occupies the half space below y=0, and the wave propagates in the +y direction.
Figure 13:
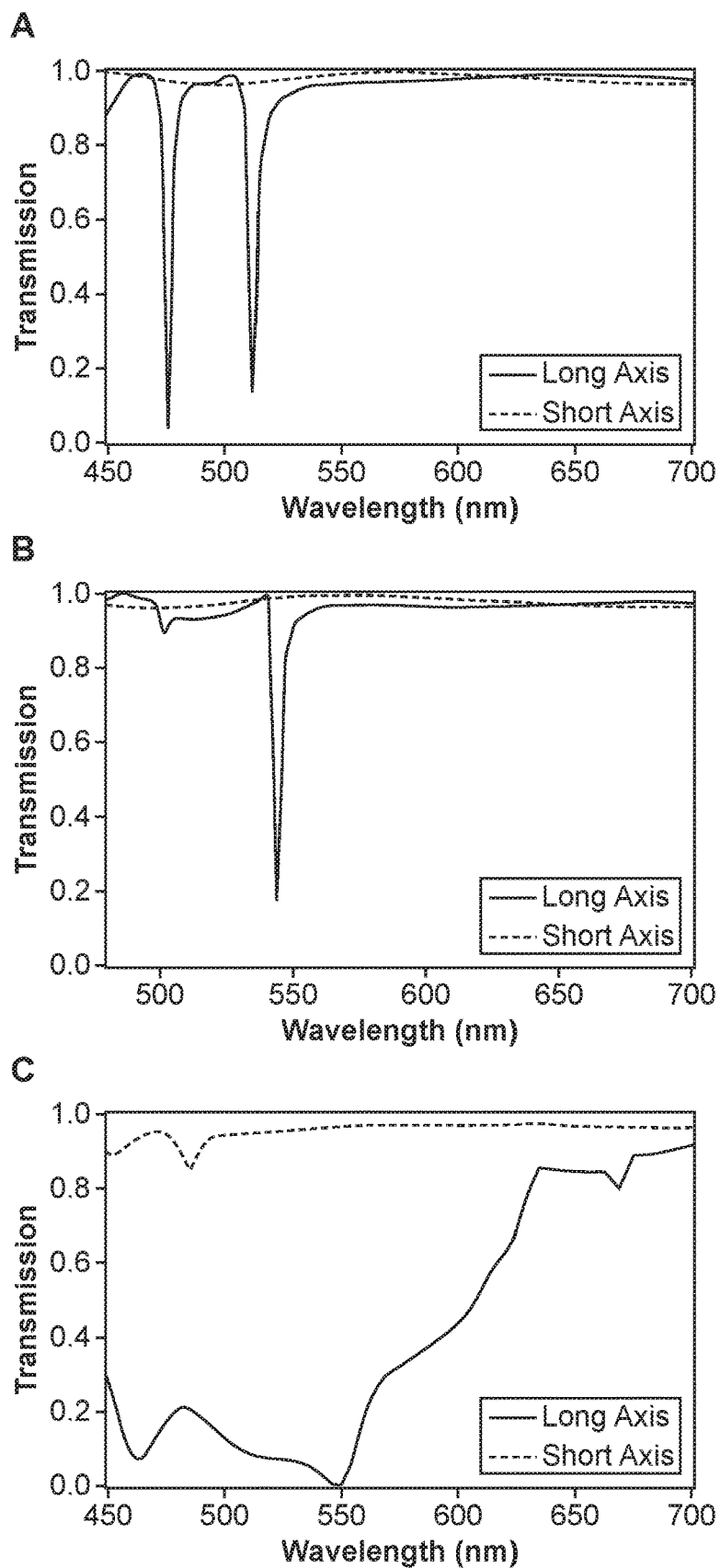
FIG. 13. Simulated transmission spectra for $TiO_2$ nanofins on a periodic lattice at design wavelengths of (A) about 480 nm, (B) about 532 nm, and (C) about 660 nm. In each panel, the solid (dashed) line corresponds to an incident plane wave source polarized along the long (short) axis of the rectangular nanofins.

FIG. 7A-C shows measured and simulated efficiencies as a function of wavelength from about 480 nm to about 800 nm for the metaholograms designed at λ=about 480, about 532, and about 660 nm, respectively (FIGS. 12 and 13 show simulated field profiles and transmission for the nanofins). An absolute efficiency is specified as a total optical power of the reconstructed Harvard logo divided by an optical power measured through an about 300×about 300 μm² square aperture, which is the same size as the hologram (see below for measurement details and FIG. 14). The experimental results generally follow the simulation data and reach maxima of about 82, about 81, and about 78% near the design wavelengths of about 480, about 532, and about 660 nm, respectively.

It is noted that, in certain cases, there are discrepancies between the simulated and measured trend. Differences between designed and fabricated nanofin dimensions and the possibility of weak coupling between nanofins likely cause these discrepancies. Additionally, the total efficiency of a geometric phase device can depend on the transmission for an electric field polarized along the long or short axis of the individual components. High transmission is observed through the components (FIG. 13), especially near the design wavelengths, but these transmission values can be further increased by exploring antireflective coatings or by impedance matching techniques.

Because the geometric phase is a wavelength-independent effect, holographic images can be generated across the visible spectrum from a single design. FIG. 7D-I shows the holographic images across the visible spectrum for the hologram with a design wavelength of about 480 nm. The subwavelength spacing and oversampling of the phase map can be seen in the images because there is sharp resolution of fine features such as the word "VERITAS" at the top of the Harvard crest. The bright spot near the center of the cross of the Harvard logo is from the zero order. However, at the design wavelength, the ratio of the intensity in the zero order to the total intensity contained in the hologram image is about 1%.

Figure 15:
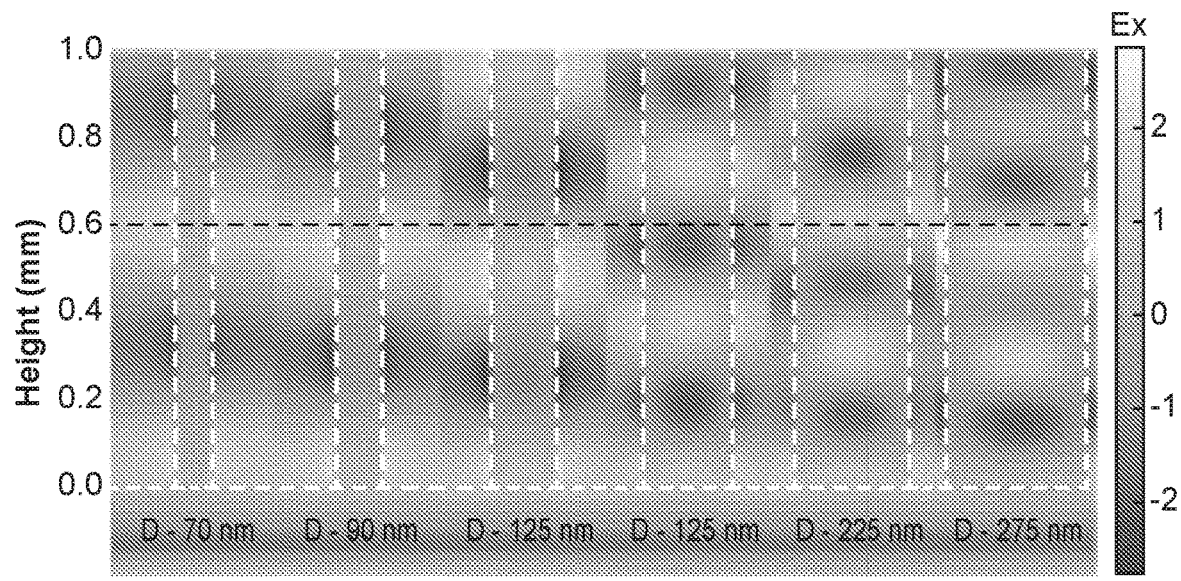
FIG. 15. Simulation of full 2π-phase coverage using $TiO_2$ nanopillars with varied diameters. The white dashed lines show the placement of the $TiO_2$ nanopillars, and the diameter of each pillar is listed below. Around each pillar, an about 325-nm cross-section of the x component of the electric field is included. The black dashed line is set to about 600 nm, corresponding to the height of the nanofins.

Although an example demonstration of the process is made using PB-phase metaholograms, the $TiO_2$ properties and fabrication process extend beyond this specific type of metasurface. For example, simulations using the measured optical constants of $TiO_2$ and structural dimensions achievable with the fabrication process show that pillar dimensions can be varied to provide full 2π-phase coverage rather than using the geometric phase (FIG. 15). Thus, DMs that use linear birefringent resonators to encode phase information can be formed. Moreover, the demonstration of full 0- to 2π-phase coverage allows the implementation of various DM components with high efficiency at visible wavelengths such as axicons, lenses, gratings, phase shifters, and polarization beam splitters.

This example has detailed an experimental realization of highly efficient DMs that span the visible spectrum. ALD is used to produce smooth amorphous $TiO_2$ films that are transparent for wavelengths longer than about 360 nm and have an index of refraction that is sufficiently high to provide substantially complete phase control over an optical wavefront. The fabrication technique for these metasurfaces, including a single-step lithography, provides a streamlined process to produce highly anisotropic nanostructures that are desired for DMs. Although $TiO_2$ is used, the process is applicable to other materials that can be deposited via ALD. The fabricated metasurface holograms have high efficiencies (about 82, about 81, and about 78%) at their respective design wavelengths. The technique presented here is general and can be applied to other metasurfaces. Consideration of the optical properties of the base material and the precision of the fabrication technique allow extension of DMs to visible wavelengths. This process can allow fabrication of compact optical systems with thicknesses that are orders of magnitude less than traditional optical systems.

Materials and Methods

Device Fabrication. Devices used above were fabricated on an f-silica substrate. Substrates were first coated with hexamethyldisilazane to promote resist adhesion followed by spin coating of undiluted positive-tone EBR (ZEP-520A; Zeon Chemicals). For the devices shown, the resist is spun at about 1,750 rpm to achieve a desired resist thickness of about 600 nm. The resist was then baked at about 180° C. for about 5 min. Subsequently, samples were coated with about 10 nm of chromium via electron beam evaporation to avoid charging effects during the writing process. The patterns were exposed using an accelerating voltage of about 125 kV (ELS-F125; Elionix Inc.) and developed in o-xylene for about 60 s under gentle agitation. For the ALD (Savannah; Cambridge Nanotech) of $TiO_2$, a two-pulse system of water and the TDMAT precursor was used with an about 0.2-s water pulse followed by an about 7-s delay and an about 0.4-s TDMAT pulse followed by an about 10-s delay. The system was left under substantially continuous flow of about 20 cm³/min of $N_2$ carrier gas and was maintained at about 90° C. throughout the process. This led to an overall deposition rate of about 0.7 nm per cycle. Reactive ion etching was carried out on Unaxis inductively coupled plasma (ICP) reactive ion etching tool with a mixture of Cl$_2$ and BCl$_3$ gas (about 3 and about 8 cm$^3$/min, respectively) at a pressure of about 4 mTorr, substrate bias of about 150 V, and ICP power of about 400 W. Etch rates were typically between about 1.3 nm/s and about 1.6 nm/s. After processing was complete, the samples were exposed to UV irradiation and ozone, followed by soaking in Remover PG (Micro-Chem Corporation) for about 24 h.

Device Design and Simulation. A computed phase map, $\phi(x,y)$, is translated into a spatial distribution of angles, $\theta(x,y)=\phi(x,y)/2$, that sets the rotation angle of a given nanofin at position (x,y). The size of each metahologram is about 300×about 300 µm$^2$, composed of about 600-nm-tall TiO$_2$ nanofins. Simulations were performed using 3D finite-difference time-domain method (FDTD; Lumerical Inc.). The nanofin's height, width, and length were optimized to provide a π-phase shift between its major and minor axis, which is desired to achieve maximum conversion efficiency based on the geometrical phase (see FIGS. 12 and 13).

Device Measurement. Devices were characterized using the setup shown in FIG. 14 composed of a fiber-coupled laser source (supercontinuum laser; NKT Photonics), linear polarizers, quarter waveplates, a lens, and a camera/detector. Measurements were carried out using circularly polarized light for PB phase. A linear polarizer and quarter waveplate at the input generated the circularly polarized light, and the set of quarter waveplate and linear polarizer at the output filtered out unconverted light—light whose helicity is substantially the same as the input light.

Optical Characterization. Blanket TiO$_2$ films are deposited via ALD onto silicon substrates to prepare samples for spectroscopic ellipsometry (SE) measurements. When more than one material is present for SE measurements, a model should be developed to extract the complex refractive index, $\tilde{n}(\omega)=n(\omega)+ik(\omega)$, of a specific layer. In this case, a standard model is used for the substrate, and the TL model for amorphous materials is used for the TiO$_2$ film.

The TL model used to extract the optical constants of the ALD TiO$_2$ is a combination of the normal quantum mechanical Lorentz oscillator and the Tauc model derived for the imaginary part of the dielectric constant for amorphous materials above the bandgap. The Tauc model assumes a set of N noninteracting oscillators per unit volume and arrives at the following expression for the imaginary dielectric constant:

$$\varepsilon_2 = \frac{A_T(E - E_g)^2}{E^2},$$

where $A_T$ is the amplitude of the oscillator and $E_g$ is the transition energy.

Figure 8:
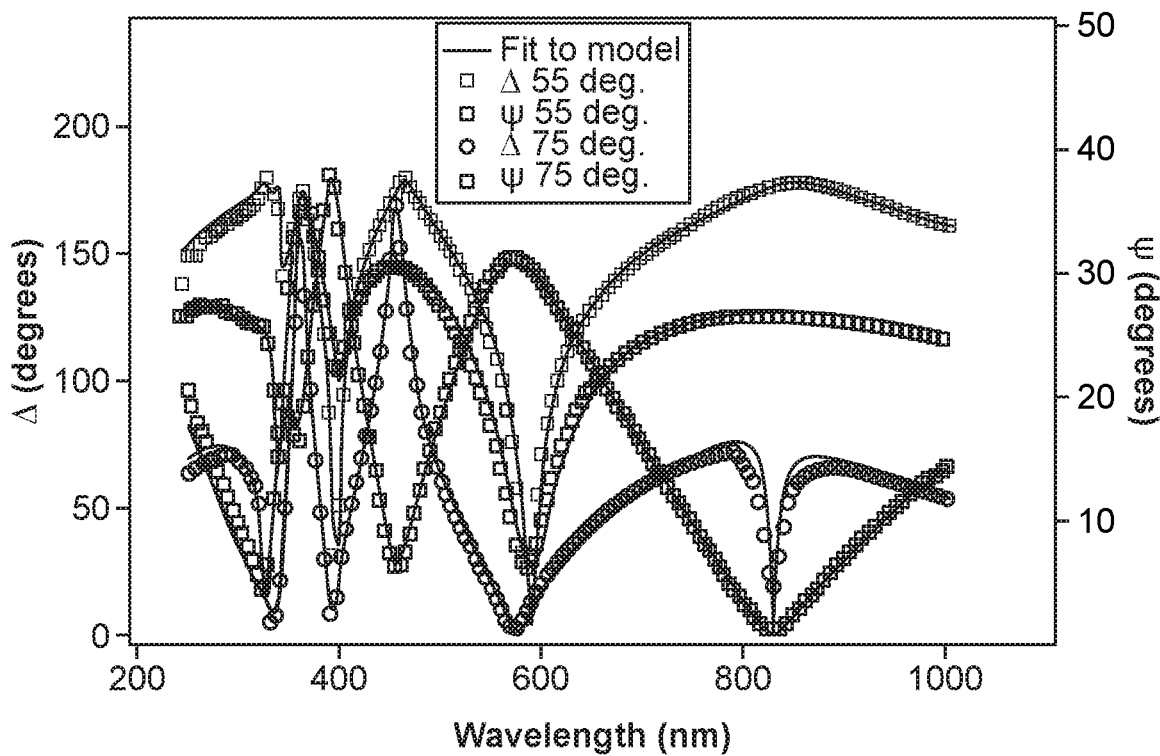
FIG. 8. Raw ellipsometry data used to determine $TiO_2$ optical constants, $\Psi$ and $\Delta$, for a $TiO_2$ film on a silicon substrate as a function of wavelength. The lighter shaded squares and circles are the values of $\Delta$ for angles of about 55° and about 75°, respectively. The darker shaded squares and circles are the $\Psi$ values for angles of about 55° and about 75°, respectively. The lines are generated data from the model described in Optical Characterization.

For the Lorentz oscillator, the imaginary part of the dielectric function is given by $$\varepsilon_2 = 2nk = \frac{A_L E_0 C E}{\left(E^2 - E_0^2\right)^2 + C^2 E^2},$$

with $E_0$ being the resonant energy of the oscillator and C accounting for broadening. Combining the two equations above leads to the TL model for the dielectric constant:

$$\varepsilon_2 = \begin{cases} \dfrac{ACE_0(E - E_g)^2}{\left(E^2 - E_0^2\right)^2 + C^2 E^2} & E > E_g \\ 0 & E \leq E_g \end{cases},$$

where A is the product of $A_T$ and $A_L$, and the other fitting parameters are specified above. The real part of the dielectric function is then obtained through Kramers-Kronig integration. The values of the four fitting parameters as well as the thickness of the film are shown in Table 1. FIG. 8 shows the raw ellipsometry data $\Psi$ and $\Delta$, and the corresponding generated data based on the model discussed above.

Structural Characterization. As stated above, the measured surface roughness of the TiO$_2$ films is on the order of the surface roughness of the underlying substrate. FIG. 9 shows an AFM scan of the fused silica substrates used in this example. From the image, an RMS roughness of about 0.600 nm is extracted. This value is comparable to the measured surface roughness of a fused silica substrate with a film deposited on top (about 0.738 pm).

To determine the atomic structure of the ALD TiO$_2$, X-ray diffraction (D8 Discover; Bruker) is used. As can be seen from FIG. 10, there are no detectable diffraction peaks from TiO$_2$, even over the large-angle scan. This diffraction spectrum is measured for a TiO$_2$ film on a 1-inch-diameter fused silica substrate, with the substrate aligned to the center of the X-ray beam via a laser alignment mark. The absence of diffraction peaks indicates that the deposited TiO$_2$ films are amorphous. In contrast, if the film was polycrystalline, the different polymorphs would generate diffraction peaks at about 27.35° for rutile or about 25° for anatase, for example.

Geometric Phase. PB phase optical components are used to implement the holograms. Here, the individual components are TiO$_2$ nanofins that act as discrete uniaxial crystals—they possess a structural birefringence that leads to a fast and slow optical axis, which introduces a phase difference between orthogonal components of an incident electrical field. It is then a spatially varying rotation of the fast axis of each nanofin that gives rise to the geometric phase accumulation. Mathematically, in Jones calculus, a waveplate with spatially varying fast axis, in the basis of left and right circularly polarized light (LCP and RCP, respectively), can be represented by the matrix:

$$T(x, y) = \cos\left(\frac{\varphi}{2}\right)\begin{bmatrix} 1 & 0 \\ 0 & 1 \end{bmatrix} - i\sin\left(\frac{\varphi}{2}\right)\begin{bmatrix} 0 & \exp[i2\theta(x, y)] \\ \exp[i2\theta(x, y)] & 0 \end{bmatrix},$$

where $\phi$ is the retardance of the waveplate and $\theta(x,y)$ represents an angle of rotation of a waveplate at position (x,y). Given a beam of arbitrary input polarization, $E_i$, the above matrix can be used to find the output state:

$$E_0 = TE_i = \cos\left(\frac{\varphi}{2}\right)E_i - i\sin\left(\frac{\varphi}{2}\right)[\langle E_i | R\rangle\exp(-i2\theta(x, y))|L\rangle + \langle E_i | R\rangle\exp(-i2\theta(x, y))|L\rangle],$$

where R and L represent the left and right circularly polarized basis vectors and $\langle E_i|R, L\rangle$ is the projection of the input polarization onto the RCP and LCP basis, respectively. A particular case of interest occurs when the polarization of the input beam is RCP or LCP and the retardation, $\phi$, is π. In this particular case, the efficiency of the system goes to unity, and the output state for an input of RCP light becomes $E_0 = \exp(-i2\theta(x,y))|L\rangle$, which shows that the output polarization is the inverse of the input polarization and the output of the beam has acquired a phase of $-2\theta(x,y)$. By the symmetry of the half waveplate, the angle $\theta(x,y)$ can vary from 0 to $\pi$, but the additional geometric of 2 means that, by locally rotating the TiO$_2$ nanofins, a full $2\pi$-phase coverage can be attained.

Metahologram Design, Simulation, and Measurement. To create the holographic images shown in FIG. 7, a binary image is used to produce a phase map via the Gerchberg-Saxton technique (FIG. 11). Simulations (3D FDTD; Lumerical) are performed, using the measured TiO$_2$ optical data shown in FIG. 4A. At a fixed height of about 600 nm, lengths and widths of the nanofins are optimized to provide the $\pi$-phase difference between two orthogonal components of the electric field ($E_x$ and $E_z$), as specified for maximum efficiency. As can be seen from FIG. 12, at the design wavelengths of about 480, about 532, and about 660 nm, the TiO$_2$ nanofins provide a $\pi$-phase delay between the x and z components of the electric field and thus act as a half waveplate.

Although each individual nanofin should introduce a $\pi$-phase shift to have a maximum conversion efficiency (ratio of power in the output circular polarization and the power in the input circular polarization with opposite handedness), the total efficiency of the devices also can depend on the transmission of each of the nanofins. FIG. 13 shows the simulated transmission spectra of the TiO$_2$ nanofins used for design wavelengths of about 480, about 532, and about 660 nm. The simulations were run with a source polarized parallel to the long or the short axis, and the simulation setup is identical to that used in FIG. 12. The transmission remains relatively high for most designs throughout the entire visible. However, the design for about 660 nm has relatively low transmission at shorter wavelengths; this is reflected in the measured efficiency and can be adjusted by allowing the optimization technique to search more exhaustively for a structure with higher transmission. Additionally, other options include provision of antireflective coatings, tapering of the nanofins, or using overlapping electric and magnetic resonances (Huygens metasurfaces) to enhance the efficiency of devices.

Figure 7:
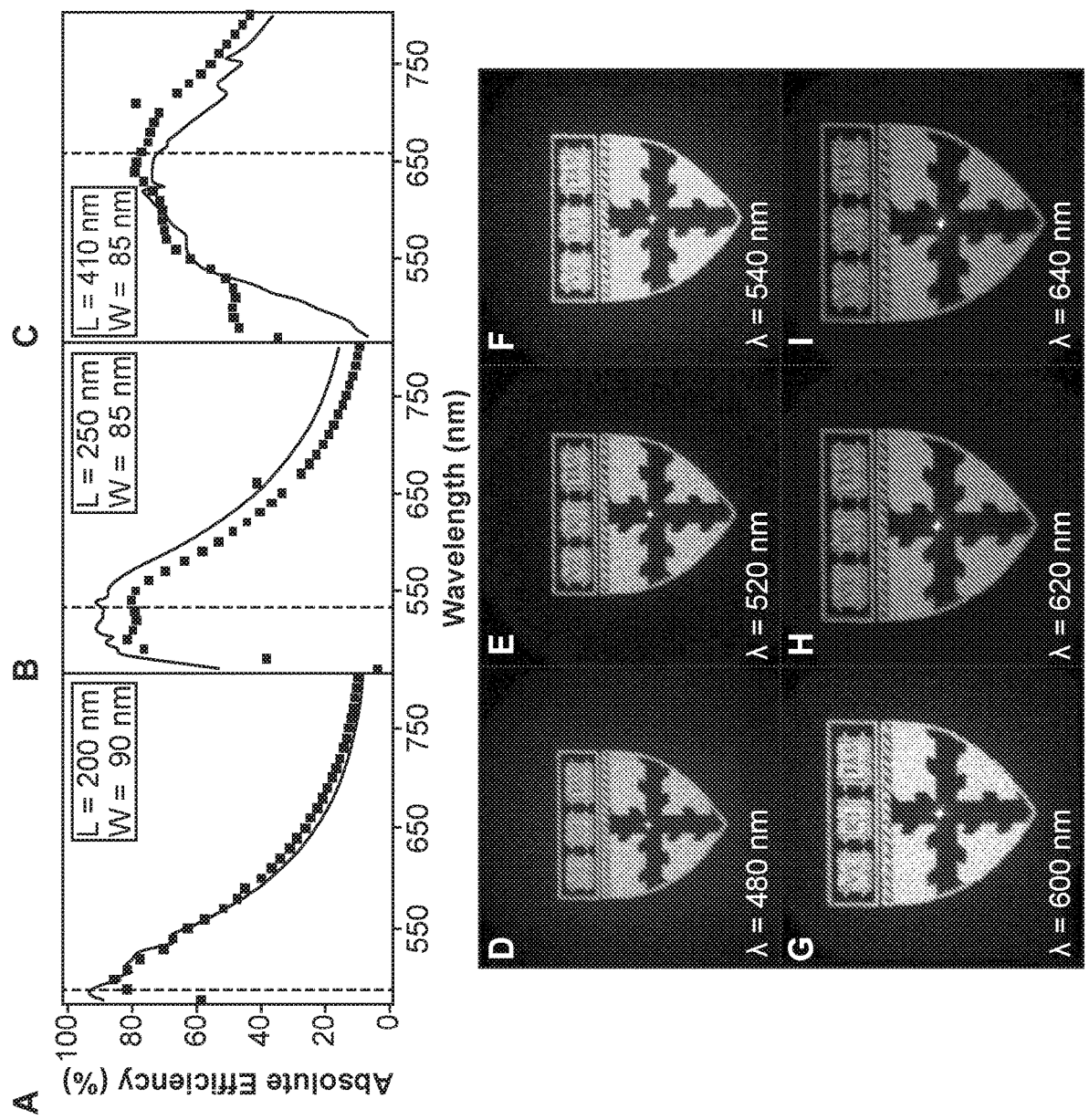
FIG. 7. Measured absolute efficiencies and holographic images. (A-C) Measured (square markers) and simulated (solid line) hologram efficiencies. An absolute efficiency is specified as a ratio of a total optical power of a hologram to a total optical power transmitted through an aperture of the same size as the hologram (about 300×300 $\mu m^2$). The vertical dashed line marks the design wavelengths of each device, and device dimensions are (A) about 200 nm×about 90 nm, (B) about 250 nm×about 85 nm, and (C) about 410 nm×about 85 nm. (D-I) Holographic images covering the visible spectrum. The input wavelength is (D) about 480 nm, (E) about 520 nm, (F) about 540 nm, (G) about 600 nm, (H) about 620 nm, and (I) about 640 nm. All images were obtained from the device designed for about 480 nm and show the broadband behavior of a single device. The bright spot in the center of the image is due to the propagation of zero-order light.
Figure 14:
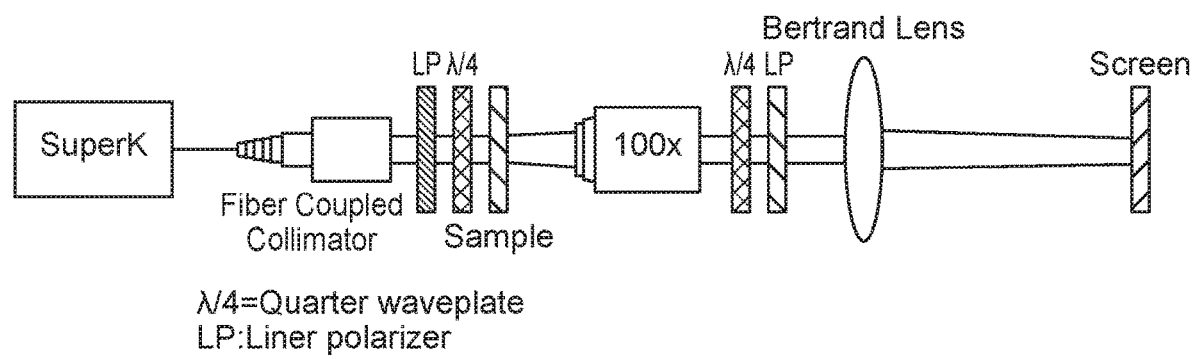
FIG. 14. Schematic of measurement setup for collecting holographic images. LP, linear polarizer; λ/4, quarter waveplate; SuperK, Supercontinuum laser.

Collection of the holographic images shown in FIG. 7 is performed using the schematic shown in FIG. 14. A supercontinuum laser provides access to wavelengths from about 470 nm to about 800 nm and sent through a collimator, linear polarizer, and quarter waveplate to inject circularly polarized light, as specified by the PB phase. The circularly polarized light is then incident on the about 300×about 300 μm$^2$ metahologram contained on the sample and is converted to a holographic image with the opposite handedness of the input light. The light that passes through the sample is then sent through a 100× objective with a numerical aperture of about 0.9. Because the spot of the collimated beam is larger than the area of the hologram, as well as to filter out any light that passes through the hologram but does not get converted (due to the TiO$_2$ nanofin not operating as a perfect half waveplate, for example), a filter in cross-polarization with respect to the input light is placed after the objective. In the case of efficiency measurements, the intensity is then measured using a power meter. For the case of collecting the holographic images, light is passed through a Bertrand lens to magnify the hologram.

Simulations for General TiO$_2$ Metasurface. The process and TiO$_2$ material properties demonstrated in this example extend beyond metasurfaces implemented using PB phase. To show that different types of metasurfaces can be formed, simulation is performed of structures with the collected n and k data of TiO$_2$ and nanostructure dimensions achievable with the process. The simulation results are shown in FIG. 15. As a diameter of a TiO$_2$ pillar is varied, fixed at a height of about 600 nm, phase differences from 0 to $2\pi$ can be produced without using geometric phase.

TABLE 1

| Fitting parameters for TiO$_2$ film | |
|---|---|
| Parameter | Value |
| Thickness, nm | 67.43 ± 0.0342 |
| A, eV | 422.4 ± 18.4 |
| E$_0$, eV | 3.819 ± 0.0304 |
| C, eV | 1.434 ± 0.0294 |
| E$_g$, eV | 3.456 ± 0.00791 |

As used herein, the singular terms "a," "an," and "the" may include plural referents unless the context clearly dictates otherwise. Thus, for example, reference to an object may include multiple objects unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" orthogonal or perpendicular can encompass a range of variation of less than or equal to ±10° relative to 90°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" parallel can encompass a range of variation of less than or equal to ±10° relative to 0°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

As used herein, the term "nanometer range" or "nm range" refers to a range of dimensions from about 1 nm to about 1 µm. The nm range includes the "lower nm range," which refers to a range of dimensions from about 1 nm to about 10 nm, the "middle nm range," which refers to a range of dimensions from about 10 nm to about 100 nm, and the "upper nm range," which refers to a range of dimensions from about 100 nm to about 1 µm.

As used herein, the term "nanostructure" refers to an object that has at least one dimension in the nm range.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the disclosure has been described with reference to the specific embodiments thereof, it should be understood by those skilled in the art that various changes may be made and equivalents may be substituted without departing from the true spirit and scope of the disclosure. In addition, many modifications may be made to adapt a particular situation, material, composition of matter, method, operation or operations, to the objective, spirit and scope of the disclosure. All such modifications are intended to be within the scope. In particular, while certain methods may have been described with reference to particular operations performed in a particular order, it will be understood that these operations may be combined, sub-divided, or re-ordered to form an equivalent method without departing from the teachings of the disclosure. Accordingly, unless specifically indicated herein, the order and grouping of the operations are not a limitation of the disclosure.

What is claimed is:

1. A method of fabricating a visible spectrum optical component, comprising:
    providing a substrate;
    forming a resist layer over a surface of the substrate;
    patterning the resist layer to form a patterned resist layer defining openings exposing portions of the surface of the substrate;
    performing deposition to form a dielectric film over the patterned resist layer and over the exposed portions of the surface of the substrate, wherein a top surface of the dielectric film is a continuous planar surface;
    removing a top portion of the dielectric film to expose the top surface of the patterned resist layer and top surfaces of dielectric units within the openings of the patterned resist layer; and
    removing the patterned resist layer to retain the dielectric units over the substrate.

2. The method of claim 1, wherein performing deposition includes performing atomic layer deposition.

3. The method of claim 1, wherein the substrate is a glass substrate.

4. The method of claim 1, wherein sidewalls of the openings of the patterned resist layer are substantially perpendicular to the surface of the substrate.

5. The method of claim 1, wherein the openings of the patterned resist layer have widths no greater than 400 nm.

6. The method of claim 1, wherein the openings of the patterned resist layer have a maximum width $w_{max}$, performing deposition includes depositing the dielectric film to a thickness $t_{film}$ and filling the openings of the patterned resist layer, and $t_{film} \geq w_{max}/2$.

7. The method of claim 1, wherein performing deposition is carried out at a temperature below 115° C.

8. The method of claim 1, wherein the dielectric film includes an oxide.

9. The method of claim 1, wherein removing the top portion of the dielectric film includes performing reactive ion etching.

10. The method of claim 1, wherein at least one of the dielectric units has a height of 100 nm or greater.

11. The method of claim 1, wherein at least one of the dielectric units has a width no greater than 100 nm.

12. The method of claim 1, wherein the dielectric units form a complementary pattern to the patterned resist layer.

13. The method of claim 1, wherein the top surface of the dielectric film is above a top surface of the patterned resist layer at the midpoint of the openings.

14. The method of claim 1, wherein the entire top surface of the dielectric film is at least as high as the patterned resist layer.

15. A method of fabricating a metasurface, comprising:
    providing a substrate and a patterned layer over the substrate, the patterned layer defining openings;
    performing atomic layer deposition to deposit a conformal film over the patterned layer and extending into the openings of the patterned layer, wherein an entire top surface of the conformal film is at least as high as the patterned layer;
    removing a top portion of the conformal film to expose top surfaces of metasurface units within the openings of the patterned layer; and
    removing the patterned layer to retain the metasurface units over the substrate.

16. The method of claim 15, wherein performing atomic layer deposition includes depositing a dielectric material having an imaginary part of a refractive index no greater than 0.1 over the visible spectrum.

17. The method of claim 15, wherein performing atomic layer deposition includes depositing a dielectric material having a real part of a refraction index of at least 2 over the visible spectrum.

18. The method of claim 15, wherein the patterned layer includes a resist having a glass transition temperature, and performing atomic layer deposition is carried out at a temperature below the glass transition temperature of the resist.

19. The method of claim 15, wherein at least one of the metasurface units has an aspect ratio of at least 2:1.

20. The method of claim 15, wherein the metasurface units form a complementary pattern to the patterned layer.

21. The method of claim 15, wherein the top surface of the conformal film is above a top surface of the patterned layer at the midpoint of the openings.

22. The method of claim 15, wherein the top surface of the conformal film is a continuous planar surface.

* * * * *